US011147200B2

(12) United States Patent
Cvijetinovic et al.

(10) Patent No.: US 11,147,200 B2
(45) Date of Patent: *Oct. 12, 2021

(54) NOZZLE PERFORMANCE ANALYTICS

(71) Applicant: Rockwell Automation Technologies, Inc., Mayfield Heights, OH (US)

(72) Inventors: Mikica Cvijetinovic, North Royalton, OH (US); Gregory J. Vance, Brunswick, OH (US); Francisco P. Maturana, Lyndhurst, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 93 days.

This patent is subject to a terminal disclaimer.

(21) Appl. No.: 16/806,336

(22) Filed: Mar. 2, 2020

(65) Prior Publication Data
US 2020/0205324 A1 Jun. 25, 2020

Related U.S. Application Data

(63) Continuation of application No. 16/111,712, filed on Aug. 24, 2018, now Pat. No. 10,624,251.

(51) Int. Cl.
*H05K 13/00* (2006.01)
*H05K 13/08* (2006.01)
(Continued)

(52) U.S. Cl.
CPC ..... *H05K 13/083* (2018.08); *G05B 19/41875* (2013.01); *H05K 13/089* (2018.08);
(Continued)

(58) Field of Classification Search
CPC .............. H05K 13/083; H05K 13/089; H05K 13/0895; H05K 13/0409; H05K 13/041;
(Continued)

(56) References Cited

U.S. PATENT DOCUMENTS 5,212,881 A   5/1993 Nishitsuka et al.
6,088,663 A * 7/2000 Wang ..................... G01J 3/462
                                              702/179
(Continued)

FOREIGN PATENT DOCUMENTS

EP   3 018 596 A1   5/2016
EP   3 037 901 A2   6/2016
(Continued)

OTHER PUBLICATIONS

Aspragathos, N. A. "Cartesian trajectory generation under bounded position deviation." Mechanism and machine theory 33.6 (1998) : 697-709. (Year: 1998).*

(Continued)

*Primary Examiner* — Michael D Masinick
(74) *Attorney, Agent, or Firm* — Amin, Turocy & Watson, LLP

(57) ABSTRACT

A pick and place nozzle performance analytics system streams production data from pick and place machines used in electronic assembly to a cloud platform as torrential data streams, and performs analytics on the production data to track, visualize, and predict performance of individual nozzles in terms of rejects or miss-picks. The analytics system generates a performance vector for each nozzle based on the collected production data, the performance vector tracking both the accumulated rejects and the percentage of rejects as respective dimensions of an x-y plane.

(Continued)

The system monitors and analyzes the trajectory of this vector in the x-y plane to predict when performance degradation of the nozzle will reach a critical threshold. In response to predicting that nozzle performance degradation will exceed a threshold at a future time, the system can generate and deliver notifications to appropriate client devices.

20 Claims, 14 Drawing Sheets

(51) Int. Cl.
  *G05B 19/418* (2006.01)
  *H05K 13/04* (2006.01)
(52) U.S. Cl.
  CPC .............. *H05K 13/0895* (2018.08); *G05B 2219/32194* (2013.01); *G05B 2219/42155* (2013.01); *H05K 13/041* (2018.08); *H05K 13/0409* (2018.08)
(58) Field of Classification Search
  CPC .... G05B 19/41875; G05B 2219/32194; G05B 2219/42155; G05B 19/4184; Y02P 90/80; Y02P 90/02; G06Q 10/08; G06Q 10/06; G06Q 10/04; G06Q 10/0639; G06Q 50/04; G06F 16/24556; G06F 16/2462
  See application file for complete search history.

(56) References Cited

U.S. PATENT DOCUMENTS

| | | |
|---|---|---|
| 7,570,392 B2 * | 8/2009 | Takahashi ............ H04N 1/4052 347/12 |
| 10,624,251 B2 * | 4/2020 | Cvijetinovic .......... G06Q 10/08 |
| 2002/0099466 A1 | 7/2002 | Diggin et al. |
| 2020/0068759 A1 * | 2/2020 | Cvijetinovic ...... H05K 13/0895 |
| 2020/0205324 A1 * | 6/2020 | Cvijetinovic ...... H05K 13/0895 |

FOREIGN PATENT DOCUMENTS

| | | | |
|---|---|---|---|
| WO | WO-2008115532 A1 * | 9/2008 | .......... G01B 11/272 |
| WO | 2014/138890 A1 | 9/2014 | |

OTHER PUBLICATIONS

Notice of Allowance received for U.S. Appl. No. 16/111,712 dated Dec. 2, 2019, 38 pages.
Extended European Search Report received for European Patent Application Serial No. 19193288.8 dated Dec. 5, 2019, 8 pages.

* cited by examiner

NOZZLE PERFORMANCE ANALYTICS

CROSS-REFERENCE TO RELATED APPLICATIONS

This application is a continuation of, and claims priority to, U.S. patent application Ser. No. 16/111,712, filed on Aug. 24, 2018, and entitled "NOZZLE PERFORMANCE ANALYTICS," the entirety of which is incorporated herein by reference.

BACKGROUND

The subject matter disclosed herein relates generally to industrial automation, and, more particularly, performance analysis of pick and place machines

BRIEF DESCRIPTION

The following presents a simplified summary in order to provide a basic understanding of some aspects described herein. This summary is not an extensive overview nor is intended to identify key/critical elements or to delineate the scope of the various aspects described herein. Its sole purpose is to present some concepts in a simplified form as a prelude to the more detailed description that is presented later.

In one or more embodiments, a system for collecting and analyzing nozzle performance data in terms of a component mis-pick or a component recognition failure is provided, comprising a data streaming component configured to transfer production data collected from one or more pick and place machines to a cloud platform or an edge device as a data stream, wherein the production data comprises performance data for respective nozzles of the one or more pick and place machines; a data aggregation component configured to generate performance vector data for a nozzle, of the respective nozzles, based on the production data, wherein the performance vector data defines a location, over time, of a vector point of the nozzle within an x-y plane, and the data aggregation component determines the location of the vector point as a plot of a total number of rejects for the nozzle on a y-axis of the x-y plane and a percentage of rejects for the nozzle on an x-axis of the x-y plane; a vector analysis component configured to track a movement of the location of the vector point based on an analysis of the performance vector data; and a notification component configured to generate notification data directed to a specified client device in response to determining that the movement of the location of the vector point satisfies a defined criterion.

Also, one or more embodiments provide a method for tracking nozzle performance, comprising transferring, by a system comprising a processor, production data collected from one or more pick and place machines to cloud-based storage as a data stream; generating, by the system, performance vector data for a nozzle, of the respective nozzles, based on the production data, the performance vector data defining a location, as a function of time, of a vector point of the nozzle within an x-y plane, wherein the generating comprises determining the location of the vector point as a plot of a total number of rejects for the nozzle on a y-axis of the x-y plane and a percentage of rejects for the nozzle on an x-axis of the x-y plane; and in response to determining that a movement of the location of the vector point satisfies a defined criterion, generating, by the system, notification data directed to a specified client device.

Also, according to one or more embodiments, a non-transitory computer-readable medium is provided having stored thereon instructions that, in response to execution, cause a system to perform operations, the operations comprising transferring production data collected from one or more pick and place machines to cloud-based storage as a data stream; generating performance vector data for a nozzle, of the respective nozzles, based on the production data, wherein the performance vector data defines a location, as a function of time, of a vector point of the nozzle within an x-y plane, and wherein the generating comprises determining, as the location of the vector point, a plot of a total number of rejects for the nozzle along a y-axis of the x-y plane and a percentage of rejects for the nozzle along an x-axis of the x-y plane; tracking the performance vector data to determine a movement of the location of the vector point over time; and in response to determining that the movement of the location of the vector point over time satisfies a defined criterion, generating, by the system, notification data directed to a specified client device.

To the accomplishment of the foregoing and related ends, certain illustrative aspects are described herein in connection with the following description and the annexed drawings. These aspects are indicative of various ways which can be practiced, all of which are intended to be covered herein. Other advantages and novel features may become apparent from the following detailed description when considered in conjunction with the drawings.

DETAILED DESCRIPTION

Figure 1:
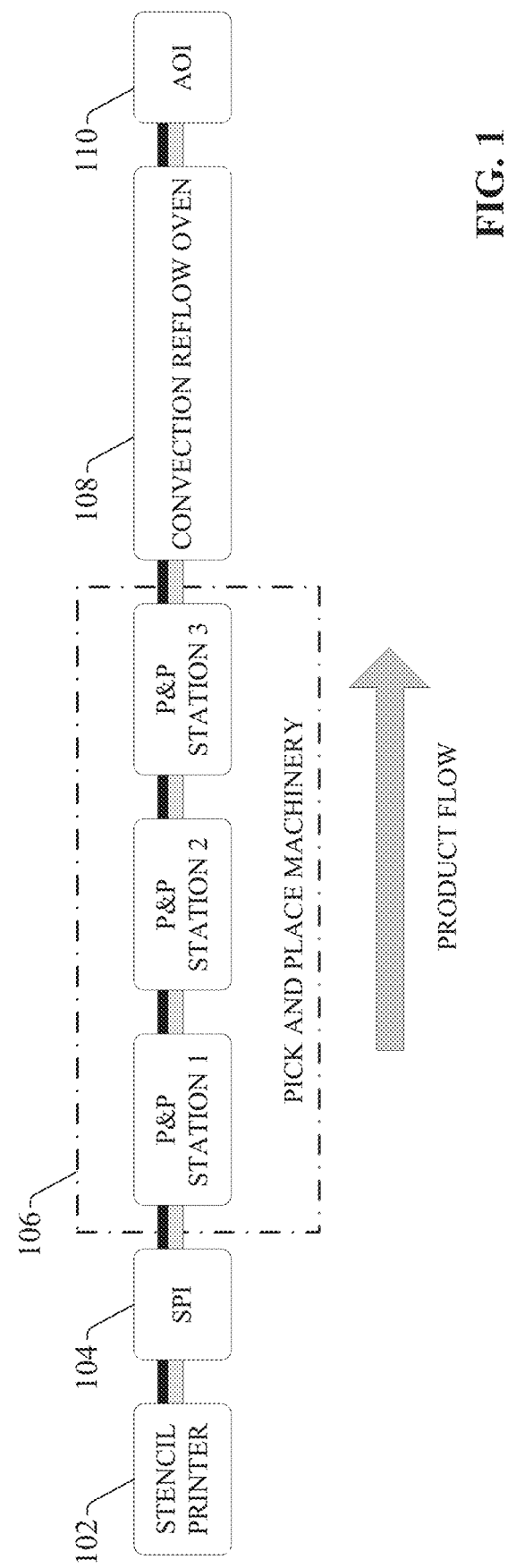
FIG. 1 is a diagram of an example electronic assembly line.

The subject disclosure is now described with reference to the drawings, wherein like reference numerals are used to refer to like elements throughout. In the following description, for purposes of explanation, numerous specific details are set forth in order to provide a thorough understanding thereof. It may be evident, however, that the subject disclosure can be practiced without these specific details. In other instances, well-known structures and devices are shown in block diagram form in order to facilitate a description thereof.

As used in this application, the terms "component," "system," "platform," "layer," "controller," "terminal," "station," "node," "interface" are intended to refer to a computer-related entity or an entity related to, or that is part of, an operational apparatus with one or more specific functionalities, wherein such entities can be either hardware, a combination of hardware and software, software, or software in execution. For example, a component can be, but is not limited to being, a process running on a processor, a processor, a hard disk drive, multiple storage drives (of optical or magnetic storage medium) including affixed (e.g., screwed or bolted) or removable affixed solid-state storage drives; an object; an executable; a thread of execution; a computer-executable program, and/or a computer. By way of illustration, both an application running on a server and the server can be a component. One or more components can reside within a process and/or thread of execution, and a component can be localized on one computer and/or distributed between two or more computers. Also, components as described herein can execute from various computer readable storage media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that provides at least in part the functionality of the electronic components. As further yet another example, interface(s) can include input/output (I/O) components as well as associated processor, application, or Application Programming Interface (API) components. While the foregoing examples are directed to aspects of a component, the exemplified aspects or features also apply to a system, platform, interface, layer, controller, terminal, and the like.

As used herein, the terms "to infer" and "inference" refer generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Furthermore, the term "set" as employed herein excludes the empty set; e.g., the set with no elements therein. Thus, a "set" in the subject disclosure includes one or more elements or entities. As an illustration, a set of controllers includes one or more controllers; a set of data resources includes one or more data resources; etc. Likewise, the term "group" as utilized herein refers to a collection of one or more entities; e.g., a group of nodes refers to one or more nodes.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches also can be used.

Industrial controllers and their associated I/O devices are central to the operation of modern automation systems. These controllers interact with field devices on the plant floor to control automated processes relating to such objectives as product manufacture, material handling, batch processing, supervisory control, and other such applications. Industrial controllers store and execute user-defined control programs to effect decision-making in connection with the controlled process. Such programs can include, but are not limited to, ladder logic, sequential function charts, function block diagrams, structured text, or other such programming structures.

Because of the large number of system variables that must be monitored and controlled in near real-time, industrial automation systems often generate vast amounts of near real-time data. In addition to production statistics, data relating to machine health, alarm statuses, operator feedback (e g , manually entered reason codes associated with a downtime condition), electrical or mechanical load over time, and the like are often monitored, and in some cases recorded, on a continuous basis. This data is generated by the many industrial devices that make up a typical automation system, including the industrial controller and its associated I/O, telemetry devices for near real-time metering, motion control devices (e.g., drives for controlling the motors that make up a motion system), visualization applications, lot traceability systems (e.g., barcode tracking), etc. Moreover, since many industrial facilities operate on a 24-hour basis, their associated automation systems can generate a vast amount of potentially useful data at high rates. The amount of generated automation data further increases as additional plant facilities are added to an industrial enterprise.

Because this disparate automation data may reside on different types of devices (e.g., databases, industrial devices, etc.) and behind proprietary interfaces, integrating this data for the purposes of trend or root cause analysis can be challenging. Often, plant engineers must be physically present at a machine of interest in order to pull data directly from devices associated with the machine. Moreover, if the data is to be assimilated with production or supply chain data from other sources, plant engineers may have to run data queries on different data sources, and the results must be associated and merged before the assimilated data can be collectively analyzed. This process of manually gathering and integrating data from different sources prevents effective real-time process monitoring and analysis of some types of industrial processes.

FIG. 1 is a diagram of an example electronic assembly line, a type of industrial system used to assembly electronic components such as printed circuit boards (PCBs). This example assembly line includes a stencil printer 102 that applies solder paste to incoming circuit boards, a solder paste inspection (SPI) station 104, a series of pick and place machines 106 that mount surface-mounted components to the boards, a connection reflow oven 108 that applies heat to the boards to melt applied solder paste, and an automated optical inspection (AOI) station 110 that uses a camera to verify quality of the final assembled PCB. The pick and place machines 106 are sophisticated equipment that can be programmed to accommodate various sizes of circuit boards based on requirements of a given PCB product. Each pick and place machine 106 carries out a pick and place operation whereby the machine picks an electronic component or part from a tape or tray and places the component on the PCB at an appropriate location as directed by a placement program executed by the machine. Pick and place machines 106 can also capture images of the components and pass the resulting image data to a vision recognition system, which analyzes the image data to ensure that the components are correctly located and oriented on each nozzle.

To facilitate picking up and placing the electronic components, each pick and place machine 106 includes multiple vacuum-based nozzles that use vacuum suction to pick up and hold the components until they are placed on the boards. The nozzles mount to various spindles contained within a head that moves at a high speed. This equipment is robotically controlled and can be programmed to optimally meet the board-layout requirements.

The pick and place operation is a data-rich procedure within the PCB manufacturing process. Typically, data generated by the pick and place operation is stored in each pick and place machine's own database. It would be beneficial to leverage the knowledge conveyed in the data generated by the pick and place machinery to learn of potential defects and other operational tendencies of interest that have yet to be discovered. One such area of interest is the failure of components to properly pick up and locate a component on the nozzle. For example, nozzle vacuum degradation (e.g., due to clogging of the nozzles, mechanical defects that worsen over time, etc.) increases the likelihood of a failed or improper pick (referred to as a mis-pick or reject). As nozzles degrade, more components are rejected and the opportunity to create a defect on the PCB increases. Depending on the nature of the defect, a panel of multiple assembled electronic modules containing defects may require up to 48 hours of delay in processing to rework in some cases. When evidence of nozzle mis-picks are discovered, a considerable amount of troubleshooting time is required to identify which nozzles should be cleaned or replaced. This can result in machine downtime and thereby reduces the operating efficiency of the pick and place machine 106.

If nozzle failures or performance degradations could be predicted, operators could be alerted to proactively repair or replace the nozzles before mis-picks become a significant problem, thereby reducing the likelihood of introducing defects into the finished products. Anticipating nozzle failure before the number of defects becomes significant can also reduce downtime by mitigating the need to stop operation in order to track down the source of defects after the nozzle has failed.

To address these and other issues, one or more embodiments described herein provide a nozzle performance analytics system capable of performing real-time and predictive performance assessments for individual nozzles of pick and place machines. In one or more embodiments, the analytics system can stream production data from pick and place machines used in electronic assembly to a cloud platform as torrential data streams, and perform analytics on the production data to track, visualize, and predict performance of individual nozzles in terms of rejects or mis-picks. The analytics system generates a performance vector for each nozzle based on the collected production data. The performance vector tracks both the accumulated rejects and the percentage of rejects as respective dimensions of an x-y plane. The system monitors and analyzes the trajectory of this vector in the x-y plane for each nozzle to predict when performance degradation of the nozzle will reach a critical threshold. In response to predicting that nozzle performance degradation will exceed a threshold at a future time, the system can generate and deliver notifications to selected client devices or operator interface terminals (e.g., human-machine interfaces). In some embodiments, the system can also deliver control outputs to a pick and place machine to alter operation of the machine in a manner that slows the rate of rejects as a result of the degraded nozzle performance In general, embodiments of the nozzle performance analytics described herein can assess pick and place machine performance in two stages—a descriptive phase using a vector-based approach, and a predictive phase using machine learning that leverages the vector slope and rate of change to forecast future performance Although the performance analytics system is described herein in the context of a pick and place machines used for electronic assembly (e.g., assembly of printed circuit boards or other electronic components), embodiments of the performance analytics system described herein can be used to describe and predict performance of pick and place operations used for other types of industrial applications. Moreover, although the pick and place machines described in the examples below use vacuum-based nozzles to pick and place components, the analytics system described herein can also assess performance of other types of pick and place components, including but not limited to robotic arms, actuators, or other components that implement pick and place functionality.

Figure 2:
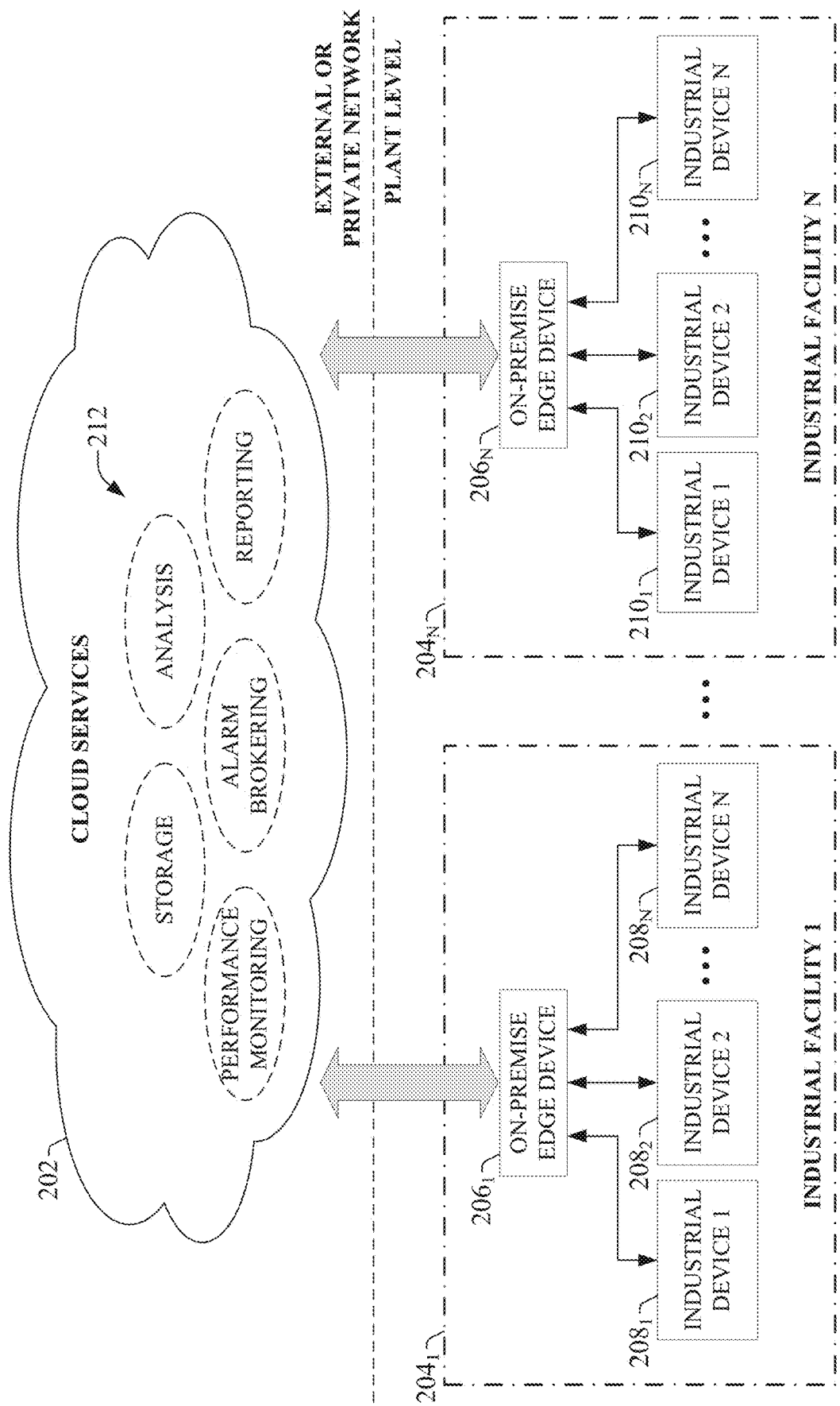
FIG. 2 a high-level overview of an industrial enterprise that leverages cloud-based services.

The nozzle analytics system described herein can execute as a service or set of services on a cloud platform in some embodiments. FIG. 2 illustrates a high-level overview of an industrial enterprise that leverages such cloud-based services. The enterprise comprises one or more industrial facilities 204, each having a number of industrial devices 208 and 210 in use. The industrial devices 208 and 210 can make up one or more automation systems operating within the respective facilities 204. Exemplary automation systems can include, but are not limited to, electronic assembly systems including pick and place machines, batch control systems (e.g., mixing systems), continuous control systems (e.g., PID control systems), or discrete control systems. Industrial devices 208 and 210 can include such devices as industrial controllers (e.g., programmable logic controllers or other types of programmable automation controllers); field devices such as sensors and meters; motor drives; operator interfaces (e.g., human-machine interfaces, industrial monitors, graphic terminals, message displays, etc.); industrial robots, barcode markers and readers; vision system devices (e.g., vision cameras); smart welders; or other such industrial devices.

Exemplary automation systems can include one or more industrial controllers that facilitate monitoring and control of their respective processes. The controllers exchange data with the field devices using native hardwired I/O or via a plant network such as Ethernet/IP, Data Highway Plus, ControlNet, Devicenet, or the like. A given controller typically receives any combination of digital or analog signals from the field devices indicating a current state of the devices and their associated processes (e.g., temperature, position, part presence or absence, fluid level, etc.), and executes a user-defined control program that performs automated decision-making for the controlled processes based on the received signals. The controller then outputs appropriate digital and/or analog control signaling to the field devices in accordance with the decisions made by the control program. These outputs can include device actuation signals, temperature or position control signals, operational commands to a machining or material handling robot, mixer control signals, motion control signals, and the like. The control program can comprise any suitable type of code used to process input signals read into the controller and to control output signals generated by the controller, including but not limited to ladder logic, sequential function charts, function block diagrams, structured text, or other such platforms.

According to one or more embodiments, on-premise edge devices 206 can collect data from industrial devices 208 and 210—or from other data sources, including but not limited to data historians, business-level systems, etc.—and send this data to cloud platform 202 for processing and storage. Cloud platform 202 can be any infrastructure that allows cloud services 212 to be accessed and utilized by cloud-capable devices. Cloud platform 202 can be a public cloud accessible via the Internet by devices having Internet connectivity and appropriate authorizations to utilize the services 212. In some scenarios, cloud platform 202 can be provided by a cloud provider as a platform-as-a-service (PaaS), and the services 212 (such as the alarm annunciation brokering system described herein) can reside and execute on the cloud platform 202 as a cloud-based service. In some such configurations, access to the cloud platform 202 and the services 212 can be provided to customers as a subscription service by an owner of the services 212. Alternatively, cloud platform 202 can be a private or semi-private cloud operated internally by the enterprise, or a shared or corporate cloud environment. An exemplary private cloud can comprise a set of servers hosting the cloud services 212 and residing on a corporate network protected by a firewall.

Cloud services 212 can include, but are not limited to, data storage, data analysis (including pick and place nozzle failure analysis), control applications (e.g., applications that can generate and deliver control instructions to industrial devices 208 and 210 based on analysis of real-time system data or other factors), performance monitoring (including pick and place machine performance monitoring), expertise brokering services, visualization applications such as the cloud-based operator interface system described herein, reporting applications, Enterprise Resource Planning (ERP) applications, notification services, or other such applications. Cloud platform 202 may also include one or more object models to facilitate data ingestion and processing in the cloud. If cloud platform 202 is a web-based cloud, edge devices 206 at the respective industrial facilities 204 may interact with cloud services 212 directly or via the Internet. In an exemplary configuration, the industrial devices 208 and 210 connect to the on-premise edge devices 206 through a physical or wireless local area network or radio link. In another exemplary configuration, the industrial devices 208 and 210 may access the cloud platform 202 directly using integrated cloud agents.

Ingestion of industrial device data in the cloud platform 202 can offer a number of advantages particular to industrial automation. For one, cloud-based storage offered by the cloud platform 202 can be easily scaled to accommodate the large quantities of data generated daily by an industrial enterprise. Moreover, multiple industrial facilities at different geographical locations can migrate their respective automation data to the cloud for aggregation, collation, collective analysis, visualization, and enterprise-level reporting without the need to establish a private network between the facilities. Edge devices 206 can be configured to automatically detect and communicate with the cloud platform 202 upon installation at any facility, simplifying integration with existing cloud-based data storage, analysis, or reporting applications used by the enterprise. In another example application, cloud-based diagnostic applications can monitor the health of respective automation systems or their associated industrial devices across an entire plant, or across multiple industrial facilities that make up an enterprise. Cloud-based lot control applications can be used to track a unit of product through its stages of production and collect production data for each unit as it passes through each stage (e.g., barcode identifiers, production statistics for each stage of production, quality test data, abnormal flags, etc.). Moreover, cloud-based control applications can perform remote decision-making for a controlled industrial system based on data collected in the cloud from the industrial system, and issue control commands to the system via the cloud agent. These industrial cloud-computing applications are only intended to be exemplary, and the systems and methods described herein are not limited to these particular applications. The cloud platform 202 can allow software vendors to provide software as a service, removing the burden of software maintenance, upgrading, and backup from their customers.

Figure 3:
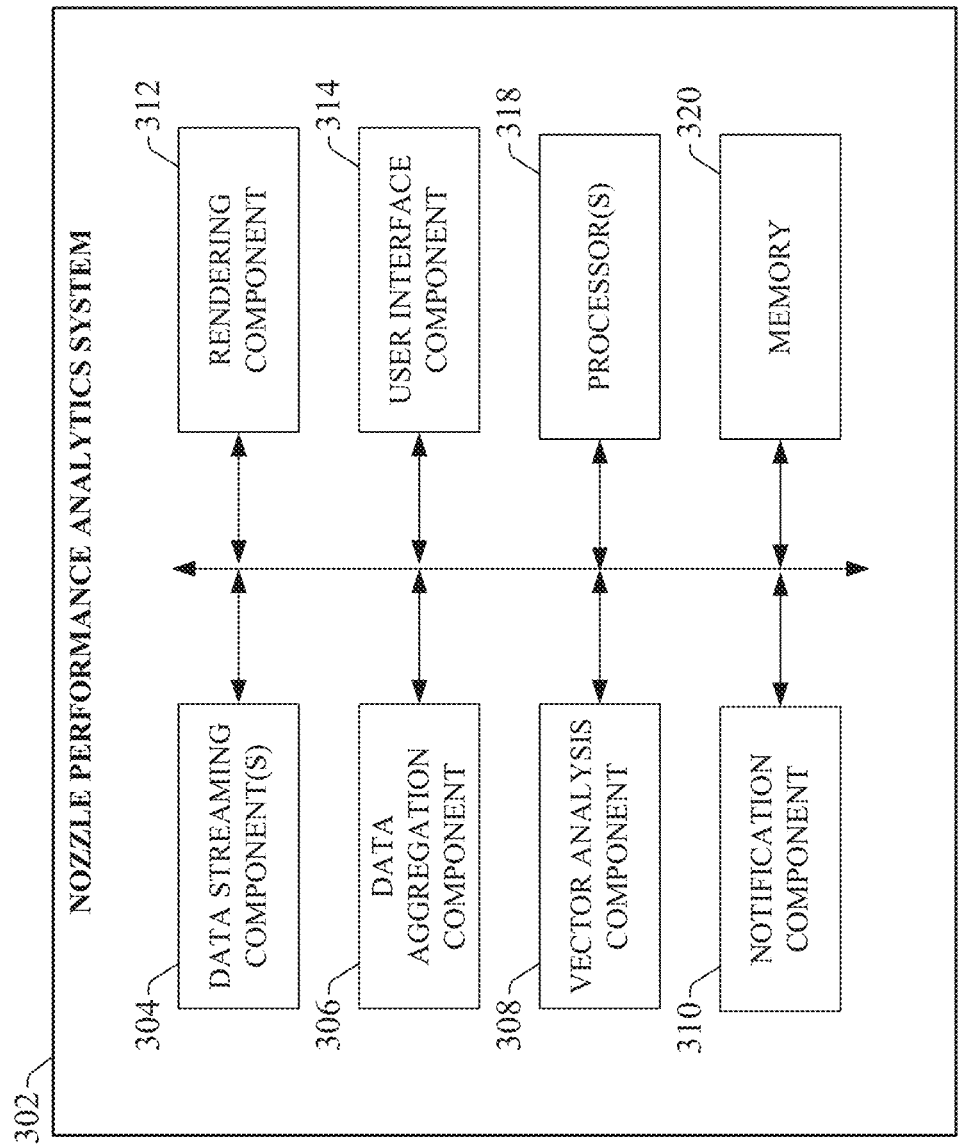
FIG. 3 is a block diagram of an example nozzle performance analytics system.

FIG. 3 is a block diagram of an example nozzle performance analytics system 302 according to one or more embodiments of this disclosure. Aspects of the systems, apparatuses, or processes explained in this disclosure can constitute machine-executable components embodied within machine(s), e.g., embodied in one or more computer-readable mediums (or media) associated with one or more machines. Such components, when executed by one or more machines, e.g., computer(s), computing device(s), automation device(s), virtual machine(s), etc., can cause the machine(s) to perform the operations described.

Nozzle performance analytics system 302 can include one or more data streaming components 304, a data aggregation component 306, a vector analysis component 308, a notification component 310, a rendering component 312, a user interface component 314, one or more processors 318, and memory 320. In various embodiments, one or more of the data streaming component(s) 304, data aggregation component 306, vector analysis component 308, notification component 310, rendering component 312, user interface component 314, the one or more processors 318, and memory 320 can be electrically and/or communicatively coupled to one another to perform one or more of the functions of the nozzle performance analytics system 302. In some embodiments, components 304, 306, 308, 310, 312, and 314 can comprise software instructions stored on memory 320 and executed by processor(s) 318. Nozzle performance analytics system 302 may also interact with other hardware and/or software components not depicted in FIG. 3. For example, processor(s) 318 may interact with one or more external user interface devices, such as a keyboard, a mouse, a display monitor, a touchscreen, or other such interface devices.

The one or more data streaming components 304 can be configured to manage migration of data from pick and place equipment at one or more industrial facilities to the cloud platform. In one or more embodiments, the system can facilitate migration of data from industrial data sources on the plant floor using produce clients and consume clients, which yield torrential data streams from the plant floor to a data lake on the cloud platform. The data aggregation component 306 can be configured to harmonize and normalize the collected data for collective analysis. This can include generating real-time and time-series performance vector data for respective pick and place machines—or for respective nozzles of each machine—based on both the total accumulated number of part rejects (e.g., mis-picks) and the percentage of part rejects calculated for the machine. Vector analysis component 308 can be configured to analyze the machine-specific performance vectors to predict future operational trends or future times of failure for pick and place nozzles or heads.

Notification component 310 can be configured to generate a notification directed to one or more recipient client devices in response to detecting a present or predicted issue with a nozzle or its associated pick and place machine. Rendering component 312 can be configured to generate dashboards or other types of graphical interfaces that render items of collected data as well as analysis results.

User interface component 314 can be configured to exchange information between the system 302 and a client device associated with an authorized user of the system 302. To this end, user interface component 314 can be configured to serve user interface screens to the client device that allow the user to view information stored or generated by the system 302 (e.g., dashboards rendering nozzle statistics in both textual and graphical formats to be discussed herein, alarm status information, etc.) and to send information to the system 302 (e.g., plant, machine, and nozzle selection input, etc.).

The one or more processors 318 can perform one or more of the functions described herein with reference to the systems and/or methods disclosed. Memory 320 can be a computer-readable storage medium storing computer-executable instructions and/or information for performing the functions described herein with reference to the systems and/or methods disclosed.

Figure 4:
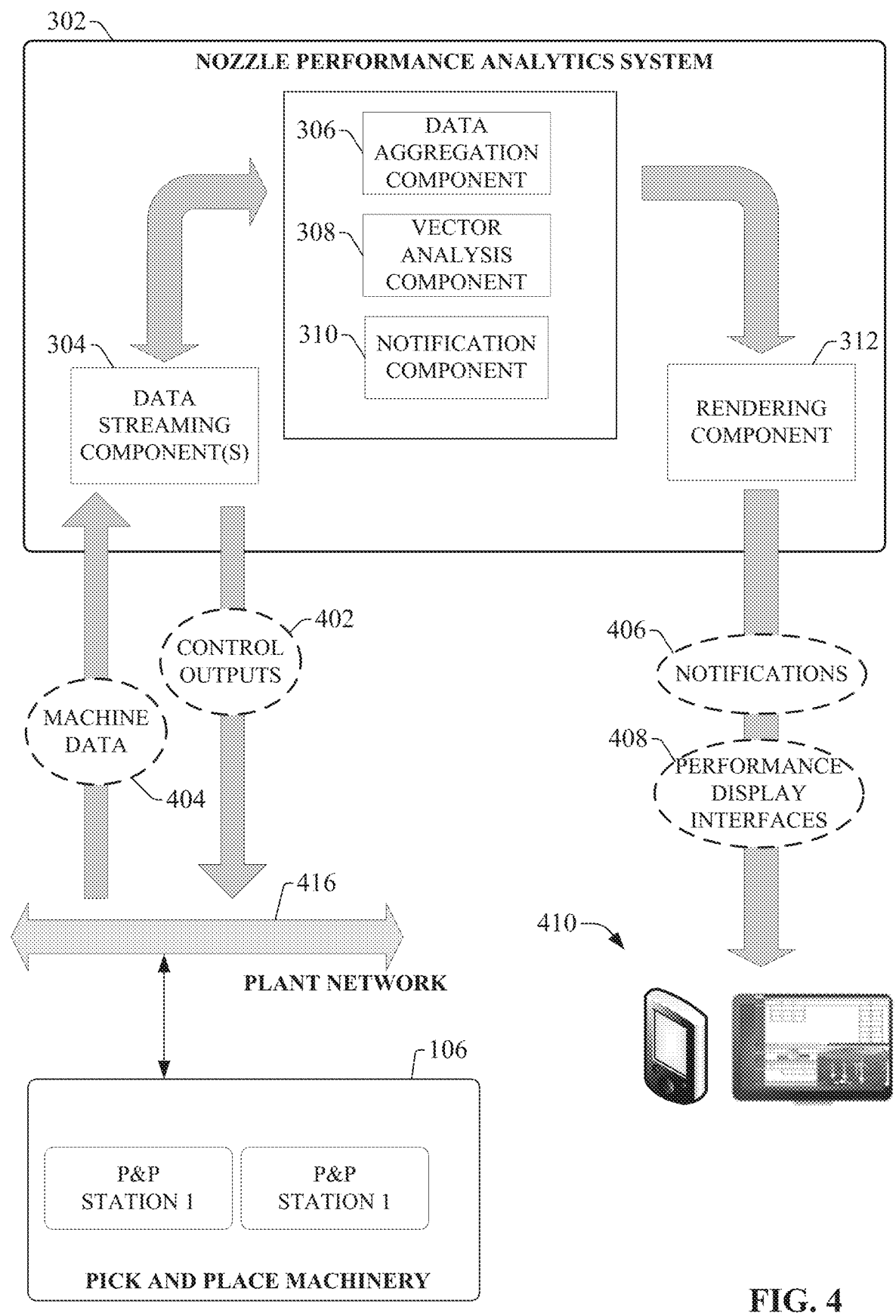
FIG. 4 is a diagram illustrating an example architecture within which embodiments of the nozzle performance analytics system can operate.

FIG. 4 is a diagram illustrating an example architecture within which embodiments of the nozzle performance analytics system 302 can operate. In this example architecture, nozzle performance analytics system 302 executes as a service on a cloud platform, and exchanges data with industrial devices at a plant facility—including devices associated with pick and place machines 106—via a plant network 416 accessible to the cloud platform (e.g., a wired or wireless network). However, in other implementations the components of nozzle performance analytics system 302 can execute on one or more servers that reside within the plant facility itself and exchange data with industrial devices via plant network 416.

The one or more data streaming components 304 of analytics system 302 gather machine data 404 from data sources associated with the pick and place machines 106. This can include, for example, real-time and historical statistical and operational data stored in local databases associated with the machines 106. Example data values that can be collected and analyzed from the pick and place machines 106 can include, but are not limited to, a total number of parts picked by each nozzle of each pick and place machine, a total number of rejected parts (or mis-picks) for each nozzle, an estimated number of missing parts for each nozzle, cycle times for each pick and place machine, alarm data for each machine, and other such information. Although only a single set of pick and place machines 106 is depicted in FIG. 4, analytics system 302 can be configured to collect data from multiple pick and place machines 106 distributed throughout a plant facility, or across multiple geographically diverse facilities.

The collected data is harmonized, normalized, and collectively analyzed by the analytic system's data aggregation component 306 and vector analysis component 308, as will be described below. As part of this processing, analytic system 302 can create a performance vector for each nozzle can detect and/or perform predictive analysis on these vectors to determine whether any of the nozzles are at risk of failure or of degraded performance Rendering component 312 can generate performance display interfaces 408 that render historical and real-time statistics for the monitored pick and place machines and deliver these interfaces to authorized client devices 410 (e.g., HMI terminals; personal mobile devices; laptop, desktop, or tablet computers, etc.) Also, in response to determining, based on the predictive analysis, that a nozzle is at risk of failure or degraded performance, notification component 310 can instruct the rendering component 312 to deliver one or more notifications 406 to selected client devices of personnel associated with the relevant pick and place machines 106, thereby notifying the recipient of the risk and recommending one or more countermeasures.

In some embodiments, analytics system 302 can also be configured to deliver control outputs 402 directed to selected control devices in response to detecting or predicting a nozzle failure or performance degradation. The control output 402 can be configured to alter operation of a selected pick and place machine 106 to either mitigate the identified performance issue or to slow the performance degradation until the defective nozzle can be repaired or replaced. For example, the control output 402 can be configured to alter an operation of the pick and place machine in a manner that slows the nozzle's current rate of rejected parts.

Figure 5:
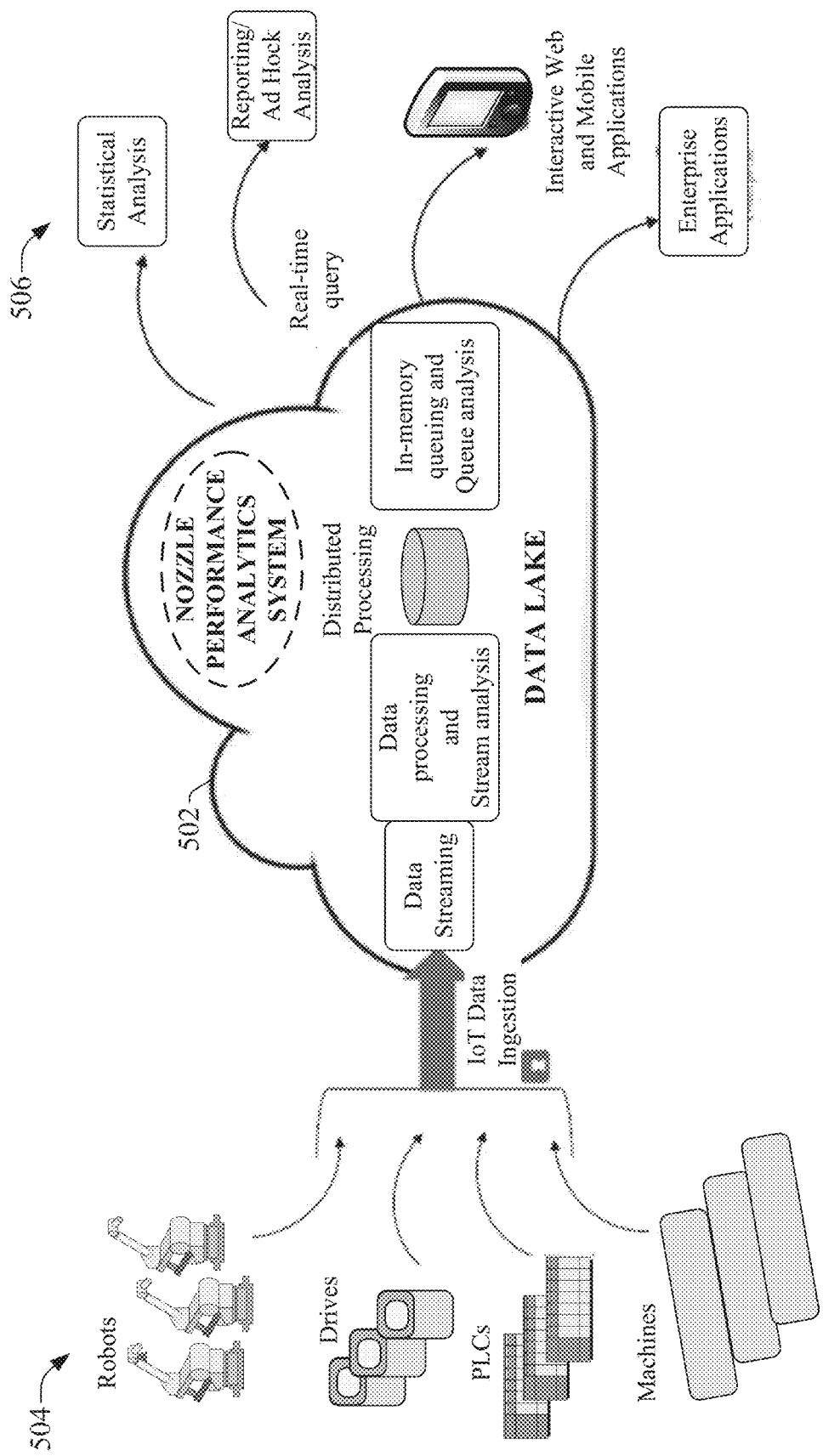
FIG. 5 is a high-level diagram illustrating data streaming and analysis of industrial data on a data lake.

In some embodiments, the nozzle analytics architecture can manage one or more data pipelines that migrate data from plant facilities to a data lake residing on the cloud platform. For systems in which data from multiple different industrial enterprises is monitored, the data streams can be segregated by industrial enterprise (customer) and can further be segregated according to any other suitable criterion (e.g., plant facility, production area, etc.). In an example implementation, the nozzle performance analytics system 302 described herein can implement a subscription layer that harmonizes and pushes data from pick and place machines 106 at one or more industrial sites to a data lake leveraged by analytics system 302. The analytics system 302 can migrate data from various industrial sites as distinct data and apply customer-specific rules to each data stream for various purposes prior to storage and analysis on the cloud platform. Performing data streaming and analytics on a data lake can facilitate system flexibility and scalability, since heterogeneous data can be stored in a raw format without extensive preprocessing (e.g., extract transform load, or ETL, processing). FIG. 5 is a high-level diagram illustrating data streaming and analysis of industrial data—including pick and place machine data—on a data lake 502 according to one or more embodiments. In this example, data lake 502 resides on a cloud infrastructure (e.g., cloud platform 202, a private cloud, or a public cloud that offers infrastructure-as-a-service).

Nozzle analytics system 302 works in connection with the data lake 502 to stream data from a variety of industrial data sources 504, including but not limited to pick and place machines and associated control and storage devices, industrial robots, motor drives (e.g., variable frequency drives or other types of drives), industrial controllers, or industrial machines or their associated control devices. The data streaming services implemented by system 302 can perform nozzle analytics on individual data streams in some embodiments. Nozzle performance analysis can be carried out on the data lake using distributed processing techniques made possible by the scalable computing resources of the data lake 502. In some embodiments, after stream analysis has been performed on the data streams, the data and any analytical results can be either stored on cloud-based storage in customer-specific data storage, or can be placed in defined data queues for queue analysis. A number of different types of applications 506 can leverage the data and analysis results generated and stored on the cloud platform, including but not limited to reporting applications, interactive web and mobile applications, enterprise applications, etc.

Figure 6:
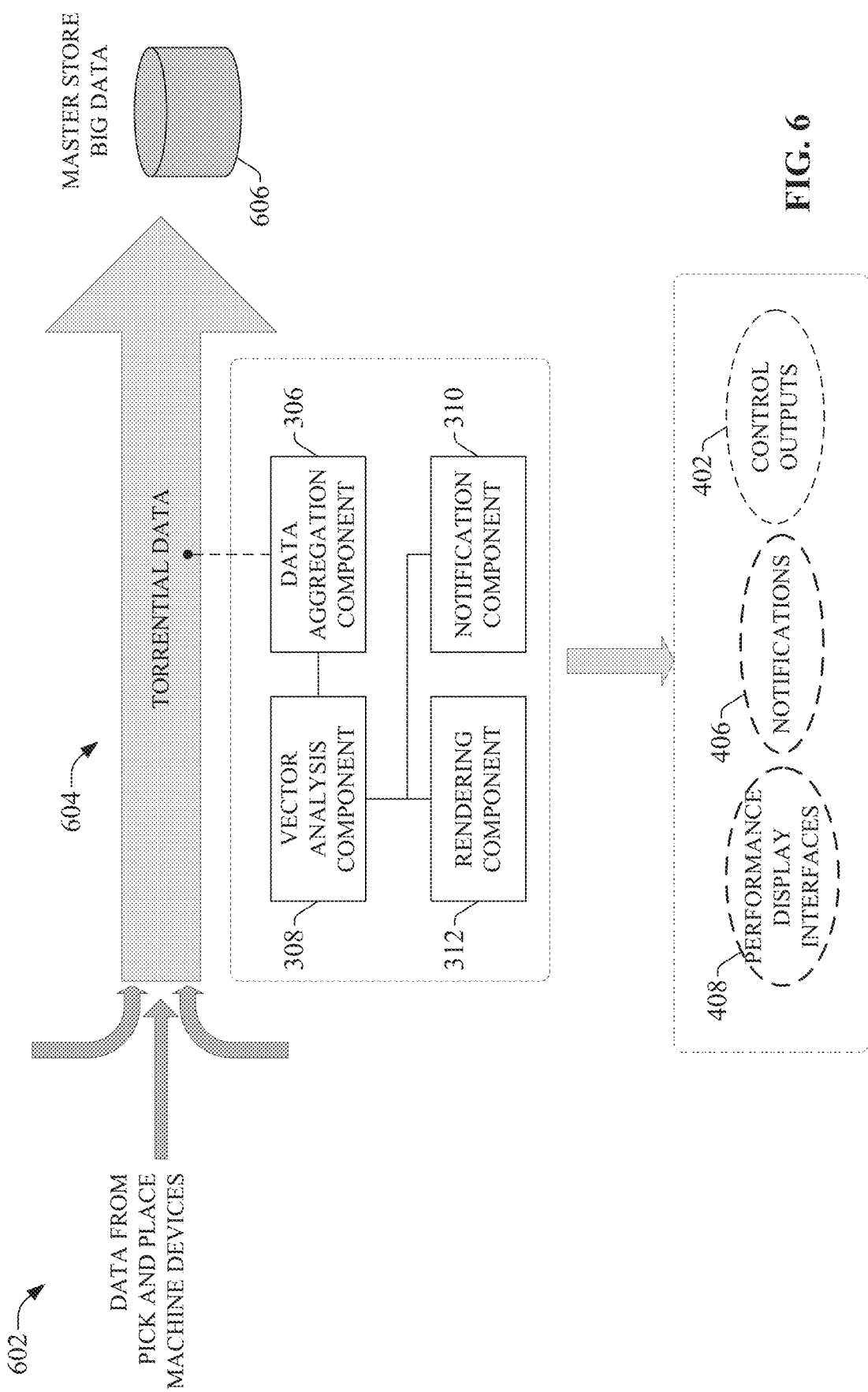
FIG. 6 is a diagram illustrating application of analytics against a data stream by a data aggregation component and a vector analysis component of a nozzle performance analytics system.

As noted above, some embodiments of nozzle performance analytics system 302 can perform stream-level analysis on the industrial data streams that migrate data from the industrial sites to the cloud system. FIG. 6 is a diagram illustrating application of analytics against a data stream by data aggregation component 306 and vector analysis component 308. In this example, the data streaming components 304 of nozzle performance analytics system 302 (e.g., one or more produce clients and consume clients) migrate data generated by one or more data sources at an industrial facility (i.e., a customer site) to cloud-based big data storage 606 by streaming the data from the data sources to the cloud as torrential data, yielding a data stream 604. The streamed data can include, for example, time-series metric data generated by sensors or other industrial devices on the plant floor (e.g., pick and place machine components, vacuum or pressure sensors, temperature sensors, flow meters, level sensors, proximity switches, etc.); inspection result data generated by automatic optical inspection station 110; alarm data generated by an industrial controller, a motor drive, a safety controller, a quality check system, etc.; or other types of data.

Figure 7:
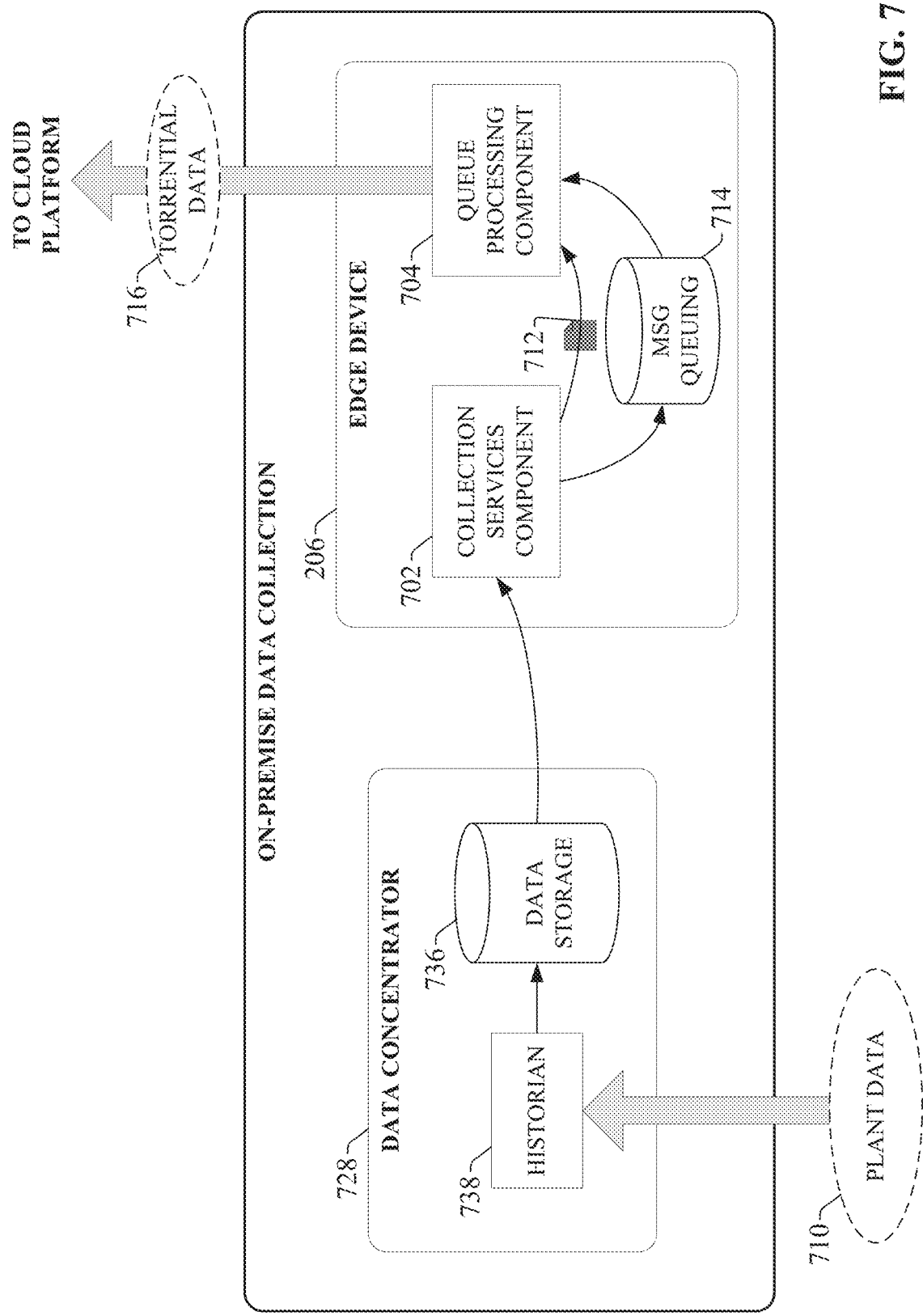
FIG. 7 is a diagram of an example edge device that can reside at the plant facility and provide data to the cloud-based analytics system.

In some embodiments, the data stream 604 can comprise data collected from the respective industrial devices at the plant facility by a dedicated on-premise edge device (e.g., edge devices 206 illustrated in FIG. 2), which interfaces with the nozzle performance analytics system 302 to facilitate streaming of torrential data to the cloud-base system. Turning briefly to FIG. 7, an example edge device 206 that can reside at the plant facility and provide data to the cloud-based analytics system 302 is illustrated. In this example technique, on-premise data collection is enabled by a collection of services that function to process and send collected industrial data to the cloud-based data pipeline. Data concentrator 728 and edge device 206 respectively implement two main functions associated with data collection—data concentration using a historian 738 and associated data storage 736 (e.g., an SQL server or other type of storage), and cloud data enablement using cloud agent services executed by edge device 206. Plant data 710 from one or more industrial devices (e.g., controllers and databases associated with pick and place machines) is collected by data concentrator 728 at the plant facility. In an example scenario, plant data 710 may comprise stamping press time-series sensor data, made up of thousands of data points updated at a rate of less than a second. Plant data 710 can also comprise alarm data generated by one or more industrial devices in response to detected alarm events.

Collection services component 702 of edge device 206 implements collection services that collect device data, either from data concentrator's associated data storage (e.g., via an SQL query) or directly from the devices themselves via a common industrial protocol (CIP) link or other suitable communication protocol. For example, to obtain data from data concentrator 728, collection services component 702 may periodically run a data extraction query (e.g., an SQL query) to extract data from data storage 736 associated with data concentrator 728. Collection services component 702 can then compress the data and store the data in a compressed data file 712. Queue processing services executed by queue processing component 704 can then read the compressed data file 712 and reference a message queuing database 714, which maintains and manages customer-specific data collection configuration information, as well as information relating to the customer's subscription to the cloud platform and associated cloud services. Based on configuration information in the message queuing database 714, queue processing component 704 packages the compressed data file 712 into a data packet and pushes the data packet to the nozzle performance analytics system 302 on the cloud platform. In conjunction with the data streaming components 304 of analytics system 302, the edge device 206 can inject the data as torrential data 716.

Message queuing database 714 can include site-specific information identifying the data items to be collected (e.g., data tag identifiers), user-defined processing priorities for the data tags, firewall settings that allow edge device 206 to communicate with the cloud platform through a plant firewall, and other such configuration information. Configuration information in message queuing database 714 can instruct edge device 206 how to communicate with the identified data tags and with the remote data collection services on the cloud platform.

In addition to collection and migration of data, one or more embodiments of edge device 206 can also perform local analytics on the data prior to moving the data to the cloud platform. This can comprise substantially any type of pre-processing or data refinement that may facilitate efficient transfer of the data to the cloud platform, prepare the data for enhanced analysis in the cloud platform, reduce the amount of cloud storage required to store the data, or other such benefits. For example, edge device 206 may be configured to compress the collected data using any suitable data compression algorithm prior to migrating the data to the cloud platform. This can include detection and deletion of redundant data bits, truncation of precision bits, or other suitable compression operations. In another example, edge device 206 may be configured to aggregate data by combining related data from multiple sources. For example, data from multiple sensors measuring related aspects of an automation system can be identified and aggregated into a single cloud upload packet by edge device 206. Edge device 206 may also encrypt sensitive data prior to upload to the cloud. In yet another example, edge device 206 may filter the data according to any specified filtering criterion (e.g., filtering criteria defined in a filtering profile stored on the edge device). For example, defined filtering criteria may specify that measured pressure values exceeding a defined setpoint are to be filtered out as outliers prior to uploading the pressure values to the analytics system 302.

Edge device 206 may also associate metadata with selected subsets of the data prior to migration to the cloud platform, thereby contextualizing the data within the industrial environment. For example, edge device 206 can tag selected subsets of the data with a time indicator specifying a time at which the data was generated, a quality indicator, a production area indicator specifying a production area within the industrial enterprise from which the data was collected, a machine or process state indicator specifying a state of a machine or process at the time the data was generated, a personnel identifier specifying an employee on duty at the time the data was generated, or other such contextual metadata. In some embodiments, the edge device 206 can also aggregate the data with external data retrieved from external sources (e.g., weather data, stock market price data, etc.) In this way, edge device 206 can perform layered processing of the collected data to generate meta-level knowledge that can subsequently be leveraged by cloud-based analysis tools to facilitate enhanced analysis of the data in view of a larger plant context.

To ensure secure outbound traffic to the cloud, one or more embodiments of edge device 206 can support HTTPS/SSL, certificate authority enabled transmission, and/or unique identity using MAC addresses. Edge device 206 can also support store-and-forward capability to ensure data is not lost if the edge device 206 becomes disconnected from the cloud platform.

Returning now to FIG. 6, the data stream 604 can be customer-specific, and may include data from multiple different devices, machines, and/or facilities. As the data is being streamed from the plant facility to cloud-based storage 606, data aggregation component 306 and vector analysis component 308 of nozzle performance analytics system 202 can process selected subsets of the data in connection with assessing performance of respective pick and place machines, including nozzle performance statistics, as will be described in more detail below. Based on results of this analysis, rendering component 312 and notification component 310 can generate and deliver performance display interfaces 408 and notifications 406 to selected client devices, as well as control outputs 402 directed to selected control devices on the plant floor.

Figure 8:
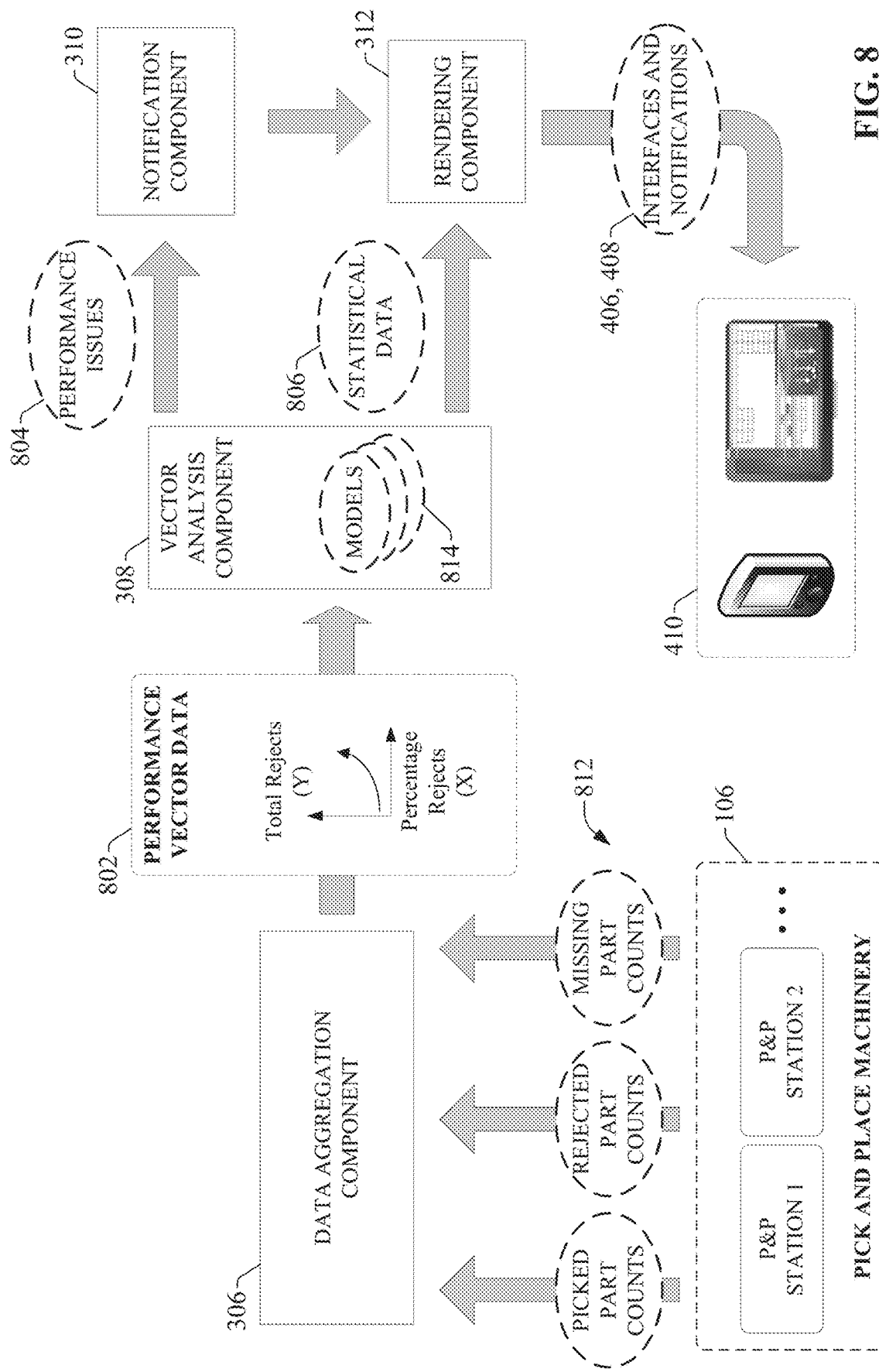
FIG. 8 is a diagram illustrating an example data flow that can be carried out by a nozzle performance analytics system in connection with analyzing nozzle performance.

FIG. 8 is a diagram illustrating an example data flow that can be carried out by the nozzle performance analytics system 302 in connection with analyzing nozzle performance As described above, production data 812 generated by control devices associated with pick and place machines 106 is collected and streamed to the cloud platform on which analytics system 302 operates (e.g., to a data lake on the cloud platform accessible to the analytics system 302). Data collected from the pick and place machinery can include, but is not limited to, a number of parts or components picked up by each nozzle of each pick and place machine, the number of rejected parts due to missed picks by each nozzle, a number of possible missing parts for each nozzle, and other such information. This data can comprise cumulative values for each nozzle that are accumulated across batches for the duration of a production run (in an example production scenario, each production run may comprise a cycle of approximately 10 minutes). In some embodiments, production data 812 may be migrated to the analytics system 302 substantially in real time as each monitored value is updated by the pick and place devices. Alternatively, updated values of production data 812 may be migrated to the analytics system 302 only at the conclusion of each batch or production run.

Data aggregation component 306 uses production data 812 to calculate a number of production statistics for each nozzle of each pick and place machine 106. This can include tracking the total accumulated number of rejects and successful picks, as well as calculating performance metrics based on this information, including a reject percentage for each nozzle. The reject percentage can be computed in various ways depending on user preference or depending on the type of statistical data available from each pick and place machine 106. For example, the reject percentage may be calculated as a percentage of the total attempted pics, as given by:

$$\% \text{ Reject} = [\# \text{ rejects}]/([\# \text{ rejects}] + [\# \text{ successful picks}]) \quad (1)$$

If production data 812 includes a cumulative value of an estimated number of missing parts, in addition to successful picks and rejected picks, the rejected percentage can be calculated according to:

$$\% \text{ Reject} = [\# \text{ rejects}]/([\# \text{ rejects}] + [\# \text{ successful picks}] + [\# \text{ missing picks}]) \quad (2)$$

In yet another example, the reject metric may be calculated as a ratio of rejected parts to successful picks, as given by:

$$\% \text{ Reject} = [\# \text{ rejects}]/([\# \text{ successful picks}]) \quad (3)$$

In some embodiments, data aggregation component 306 can be configured to pre-process the raw production data 812 prior to analysis. This can include, for example, identifying and removing outlier values that may represent invalid measurements, normalizing the production data 812 to a common format that can be collectively analyzed by the data aggregation component 306, or other such pre-processing.

To facilitate analysis of the behavior of each nozzle over time, as well as overall performance of each pick and place machine over time, data aggregation component 306 can generate performance vector data 802 for each monitored nozzle. In the example depicted in FIG. 8, performance vector data 802 is obtained by plotting, for each nozzle, the total number of rejects against the percentage of rejects, and monitoring the trajectory of this plot over time. The total accumulated number of rejects is plotted on the y-axis, and the percentage of rejects (represented by any of equations (1)-(3) above, or reasonable variations thereof) is plotted on the x-axis. In various embodiments, one or both of the total rejects (the y-axis position) or the percentage of rejects (the x-axis position) may be calculated based on all accumulated production data received since a most recent maintenance operation or replacement of the nozzle, or alternatively may be calculated based on a fixed window of most recent production data (e.g., the most recent N production cycles, where N is an integer). Moreover, performance statistics can be tracked as a function of the specific pick and place program executed by the pick and place machines 106, and the total reject and percentage reject values may represent the reject statistics for the nozzle when operated in accordance with the specific program, as will be discussed below.

Figure 9:
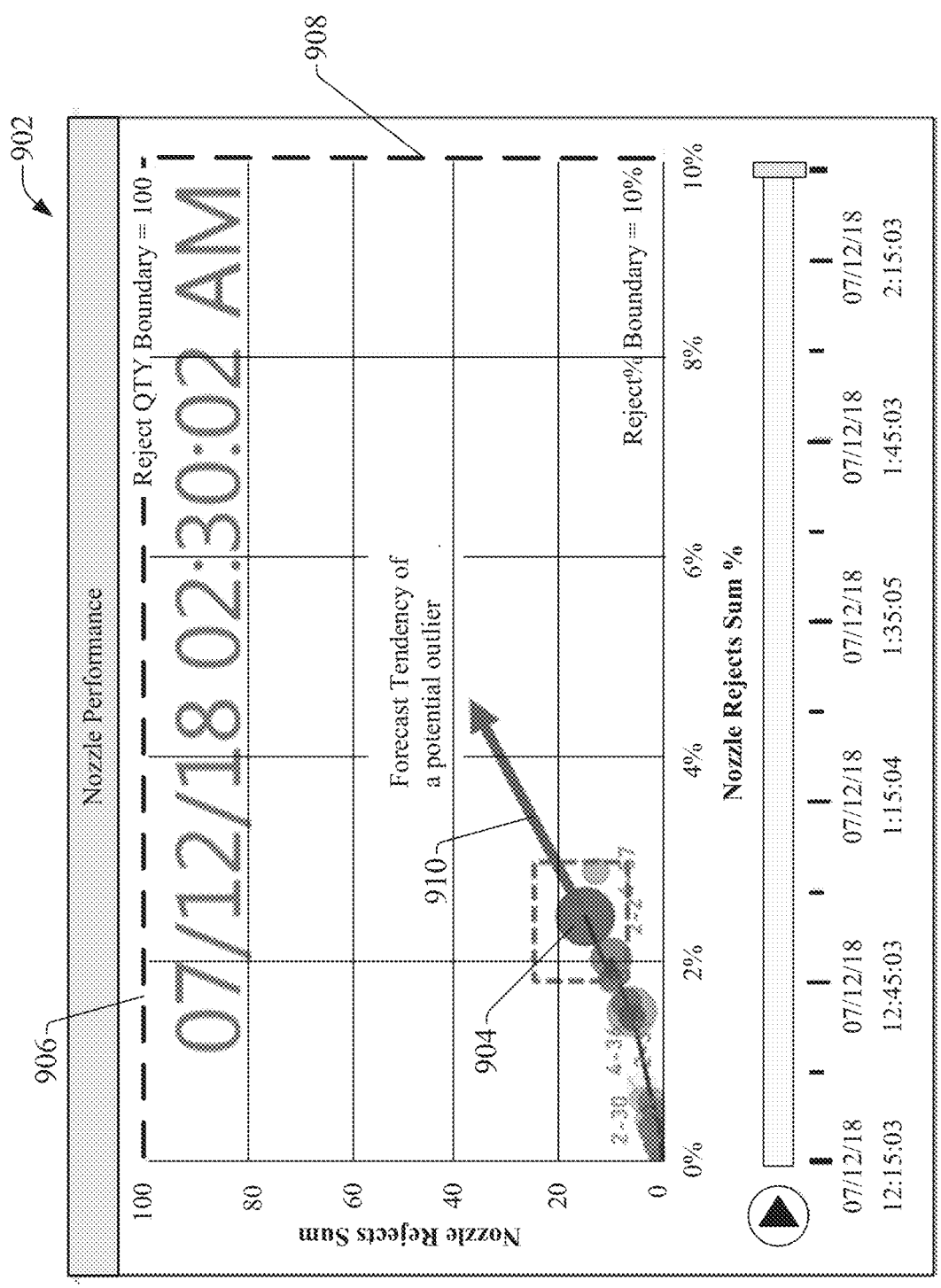
FIG. 9 is an example graphical display that plots an accumulate number of rejects and a percentage of rejects on an x-y graph for multiple nozzles.

Vector analysis component 308 can analyze the performance vector data 802 for each nozzle over time in order to track the performance behavior of the nozzle as a function of time, and in some embodiments to learn a pattern of behavior for the nozzle. FIG. 9 is an example graphical display 902 that plots the accumulate number of rejects and the percentage of rejects on an x-y graph for multiple nozzles. Rendering component 312 can generate graphical display 902 based on statistical data 806 generated by vector analysis component 308 based on performance vector data 802. Graphical display 902 renders the nozzle information in the form of a bubble chart on the x-y graph in this example implementation, where each bubble 904 represents a single nozzle. The location of each nozzle-specific bubble 904 in the x-y plane is also referred to as a vector point for the nozzle. The nozzle bubbles 904 can be color coded according to any suitable distinguishing characteristic. For example, bubbles 904 may be color coded according to the particular pick and place machine the nozzles are associated with, according to a degree of performance deterioration calculated for the nozzle (e.g., a total accumulated number of rejects or mis-picks), or other such distinguishing criteria. Performance analytics system 302 is capable of performing performance analysis on multiple nozzles concurrently and updating the graphical display 902 accordingly for the multiple nozzles currently being displayed (e.g., the N nozzles that make up a selected pick and place machine, where N is an integer).

By definition of the x-y graph depicted in FIG. 9, placement of a nozzle bubble 904 at the origin of the graph represents flawless nozzle performance whereby no rejects have been accumulated for the corresponding nozzle. As the nozzle begins rejecting parts (e.g., failing to correctly pick up a part or component due to such factors as improper vacuum levels, wear and tear on the mechanical nozzle components, environmental conditions such as humidity or pollutants that negatively impact the nozzle's ability to correctly pick up a part or component, etc.), the bubble 904 for that nozzle will begin to move away from the origin over time. Specifically, the bubble 904 for each nozzle will move upward in the y-axis directs as a function of the accumulated number of rejects for the nozzle, and will move left and right along the x-axis direction as a function of the percentage of rejects for that nozzle (e.g., as determined based on any of equations (1)-(3)). Typically, until the total number of rejects for a given nozzle are reset, the bubble 904 for that nozzle will move along the x-axis only in the upward direction, since the total number of rejects is a cumulative value that only increases (and does not decrease) over time. In contrast, movement of the bubble 904 along the x-axis may oscillate, since the percentage of rejects may vary in both directions over time as more pick operations—both successful and failed—are accumulated. However, if the nozzle is experiencing an issue that degrades performance over time, movement of the bubble 904 along the x-axis is likely to trend rightward. In general, as the bubble 904 (or vector point) for a nozzle moves away from the origin, increasing the risk of more defects to be introduced into the assembled PCB.

In addition to rendering these nozzle-specific reject statistics graphically, vector analysis component 308 can track the movement of these statistics over time for each nozzle in order to learn near-term and long-term behaviors for each nozzle. By analyzing nozzle reject trends in this manner, nozzle performance analytics system 302 can detect and/or predict performance trends and expected times of failure for each nozzle, as well as identify correlations between specific nozzle configurations and part mis-picks that would otherwise be invisible if only instantaneous measurements of nozzle performance were examined.

In an example scenario, during a production run, data aggregation component 306 updates the performance vector data 802 for each nozzle involved in the production run based on any additional accumulated rejects for the nozzle (the y-axis position) as well as updated calculated values of the reject percentage (the x-axis position). The performance vector data 802 can be updated either continuously or on a periodic basis depending on how frequently new production data 812 is migrated to the analytics system 302. As the performance vector data 802 is updated in real time, vector analysis component 308 re-positions the nozzle's current vector point (represented by bubble 904 on graphical display 902) on the x-y plane to reflect the current vector data values. Vector analysis component 308 also maintains a record of past positions of the nozzle's vector point within the x-y plane so that the nozzle's performance as a function of time can be assessed.

Based on the time-series movement of the vector point for a given nozzle, vector analysis component 308 can identify when a characteristic of the movement of the nozzle's vector point is indicative of a performance degradation requiring a maintenance action. Detection of a potential performance issue can be based on one or more characteristics of the vector point's movement, including but not limited to the direction of movement of the nozzle's vector point within the x-y plane, the rate of change of the vector point's movement in the x-y plane, or other vector characteristics. Because of the structure of the x-y plane, whereby cumulated rejects are plotted on the y-axis and percentage rejects are plotted on the x-axis, the direction and/or rate of change of each nozzle's vector point in this x-y plane can be monitored to identify possible performance degradations. For example, movement of the vector point right-ward (the positive x direction) is indicative of an increase in the reject rate, and the rate at which the vector moves in this direction also conveys a severity of this performance issue. Movement of the vector point upward (the positive y direction) with no movement rightward may pose no concern, since the rate of rejection is remaining consistent (or may be reducing if the vector point is simultaneously moving to the left). The level of concern when the vector point is moving in upward and leftward simultaneously may depend on the particular direction of movement as well as the rate of change of the vector point in this direction.

Given these considerations, as well as the specifics of the particular pick and place applications, a range of directions of movement indicative of a performance concern can be defined in the system 302. The range of directions can be defined in terms of angles of movement relative to the origin of the x-y plane, or using another directional nomenclature. In addition or alternatively, a rate of change or an incremental step change indicative of a performance concern can be defined in the system 302. For embodiments in which both directional ranges and rates of changes are defined, the system 302 can allow combinations of both direction and rate of change to be defined that, if detected, are indicative of a performance concern requiring attention. These vector characteristic definitions serve as trigger criteria for vector analysis component 308.

Once these critical vector characteristics are defined, vector analysis component 308 can monitor the directions of movement of the vector points (represented by bubbles 904) of multiple nozzles to determine whether movement of any of the vectors correspond to the critical vector characteristics—in terms of one or both of direction or rate of change—that were previously defined. In some embodiments, vector analysis component 308 can track the movement of each nozzle's vector point over a fixed duration up to the present time (e.g., the movement of the vector point over the last ten minutes, or another duration), so that the nozzle's current direction and/or rate of change can be calculated based on a most recent set of performance data. In response to determining that one or both of the direction or the rate of change of the vector point corresponds to a defined critical direction or rate of change (or combination thereof), notification component 310 can generate a notification directed to one or more selected client devices 410 associated with authorized plant personnel associated with the particular assembly line in which the nozzle operates, as will be discussed in more detail below. System 302 may also be configured to send a control output 402 in response to detection of a performance issue intended to alter performance of the corresponding pick and place machine to either slow the performance degradation of the identified nozzle or to remove the nozzle from the present pick and place operation.

In addition to tracking the present direction and/or rate of change of the vector point, some embodiments of vector analysis component 308 can also track the movement of the nozzle's vector point within the x-y plane over time as a vector, and predict a future trend of the vector point based on analysis of the direction, magnitude, and speed of this vector. In FIG. 9, the predicted future trend for an example nozzle represented by bubble 904 is represented by arrow 910. In some embodiments, rendering component 312 can be configured to plot arrow 910 representing the predicted future trajectory for a selected nozzle (e.g., in response to selection of the nozzle by the user via interaction with the graphical display).

Based on analysis of the predicted future reject trend represented by arrow 910—and in particular the direction, magnitude, and speed or rate of change of the future trend—vector analysis component 308 can predict when the performance of the nozzle, in terms of rejected parts or mis-picks, will deteriorate to a point at which a maintenance action will be required to correct the issue. To this end, analytics system 302 can allow end users to define (via user interface component 314) performance thresholds representing upper limits on acceptable number of accumulated rejects for a nozzle and acceptable reject percentages for a nozzle. Rendering component 312 can render the user-defined total reject upper limit on graphical display 902 as horizontal reject quantity boundary line 906. Similarly, rendering component 312 can render the user-defined reject percentage upper limit on graphical display 902 as vertical reject percentage boundary line 908. By visualizing the nozzle-specific bubbles 904 on the x-y plane relative to boundary lines 906 and 908, graphical display 902 provides a visual indication of how close each nozzle's performance is the maximum allowable number of accumulated rejects and the maximum allowable reject percentage.

In addition to visualizing these nozzle performance statistics, nozzle performance analytics system 302 can also be configured to generate and deliver reactive or proactive notifications 406 to selected client devices in response to a determination by vector analysis component 308, based on analysis on the predicted future trend of a nozzle (represented by arrow 910), that the nozzle's performance is at risk of reaching the user-defined reject boundaries represented by lines 906 and 908, or another preconfigured threshold. For example, based on predictive analysis performed on the expected future trend for a given nozzle, vector analysis component 308 can estimate future x-y positions of the vector point (graphically represented by bubble 904), and thereby estimate a future time at which the nozzle will exceed either the maximum number of acceptable accumulated rejection (boundary line 906) or the maximum acceptable reject percentage (boundary line 908). The future x-y positions can be predicted based on analysis of past x-y positions up to the present moment, as well as past rates of change of the x-y positions and the directions of the position changes, which can be combined to compute the estimated future trend vector of the nozzle's performance (arrow 910) from the present moment through a future moment representing the limit of accurate prediction. Any suitable technique for performing predictive analysis on the performance vector data 802 for a nozzle is within the scope of one or more embodiments of this disclosure (e.g., analysis of the slope of the past and predicted future vector represented by performance vector data, as well as analysis of the rate of change of the vector). In some embodiments, analytics system 302 can be configured to regulate the formation of false positive detections, since a given nozzle may change its performance vector in a benign direction, inhibiting its previous state.

In response to determining that the duration between the present time and the expected future time at which the nozzle's performance is expected to reach a reject boundary is less than a notification threshold (that is, the duration until the nozzle's performance is expected to degrade to an unacceptable level is sufficiently small to warrant a maintenance action), notification component 310 can generate a notification directed to one or more selected client devices 410 associated with authorized plant personnel associated with the particular assembly line in which the nozzle operates.

Notifications generated by notification component 310 in response to either a real-time or predicted performance issue can identify such information as an identity of the pick and place machine in which the nozzle operates, an identity of the faulty nozzle, an expected time until the nozzle's performance is expected to reach one of the reject boundaries, a current number of accumulated rejects for the nozzle, a current reject percentage for the nozzle, a recommended countermeasure for correcting the nozzle's performance (e.g., replacement of the nozzle, correction of vacuum levels, etc.).

In addition to generating proactive notifications based on the predictive analysis described above, performance analytics system 302 can also be configured to generate reactive notifications in response to determining that a vector's performance vector has crossed one of the thresholds. Such reactive notifications can identify the pick and place machine containing the degraded nozzle, as well as the particular nozzle whose performance has deteriorated beyond the defined threshold.

In some embodiments, as analytics system 302 tracks cumulative behavior and performance of each nozzle over time, vector analysis component 308 can generate performance model data 814 for each nozzle. This performance model data 814 represents expected behavior of the model over time, and can be generated based on monitored historical performance of each nozzle. Performance model data 814 can model such behavior characteristics as expected rates of performance degradation over time (where the rates of degradation may themselves change over the nozzle's lifecycle), expected vector curves in the x-y plane (that is, the plane of accumulated rejects plotted against the percentage rejects), expected reject rates at given times within the nozzle's life cycle, or other such behavior characteristics. Vector analysis component 308 can update performance model data 814 for each nozzle as new production data 812 is received and analyzed. This accumulated model data 814 can be referenced by vector analysis component 308 in connection with predicting future performance trends for the nozzle given current behaviors of the nozzle.

Some pick and place machines 106 are capable of executing different pick and place programs, each of which is designed to assemble a specific type of product (e.g., a type of printed circuit board or other type of electronic assembly). In some cases, different pick and place programs may employ different subsets of available nozzles within the pick and place machine, and some nozzles' roles in the assembly process may vary between the programs. For example, a first pick and place program that executes on a machine may comprise a set of 20 nozzle, while a second program may employ a different set of 20 individual nozzles or combination of some original nozzles and other nozzles that are tracked by a unique identifier. Moreover, a nozzle that participates in multiple different assembly programs may be programmed to behave differently in each program (e.g., the path of movement of the nozzle may vary depending on the program). As such, the expected performance of a given nozzle may depend in part on the particular pick and place program that is currently controlling the nozzle.

Accordingly, in some embodiments, in addition to tracking and predicting cumulative nozzle performance across all programs (that is, regardless of the pick and place program that is being executed), nozzle performance analytics system 302 can also be configured to track nozzle behavior separately for respective different pick and place programs. In such embodiments, when generating performance vector data 802 for a current production run in which a selected pick and place program is being executed, data aggregation component 306 can exclude historical performance data generated during execution of other pick and place programs, and consider only historical performance data for the nozzle during production runs in which the selected pick and place program was executed. Similarly, vector analysis component 308 can maintain, for each nozzle, both total accumulative model data for the nozzle across all programs, as well as separate sets of model data representing performance of the nozzle during execution of respective different pick and place programs. Depending on the type of analysis requested by the user, vector analysis component 308 can analyze performance vector data 802 using either the cumulative (non-program-specific) model data for the nozzle or the program-specific model data for the nozzle.

In some embodiments, rendering component 312 can set the size of each bubble 904 to represent an accumulated number of rejects for the corresponding nozzle across all programs in which the nozzle has been used. In such embodiments, when graphical display 902 is set to render program-specific positions of bubbles 904 within the x-y plane of graphical display 902, the y-axis position of each bubble 904 represents the cumulative number of rejects for the currently executing pick and place program only, while the size (radius) of bubble 904 represents the cumulative number of rejects for that nozzle across all programs. In this way, graphical display 902 can convey a view of both program-specific nozzle performance and overall nozzle performance within the same graphical presentation. In some embodiments, the radius of bubble 904 can be a function of multiple variables or measures over individual time periods to highlight the reject intensity for a given time period by program. In other embodiments, the radius of bubble 904 can be a product of the number of rejects and the reject percentage for the nozzle.

Figure 10:
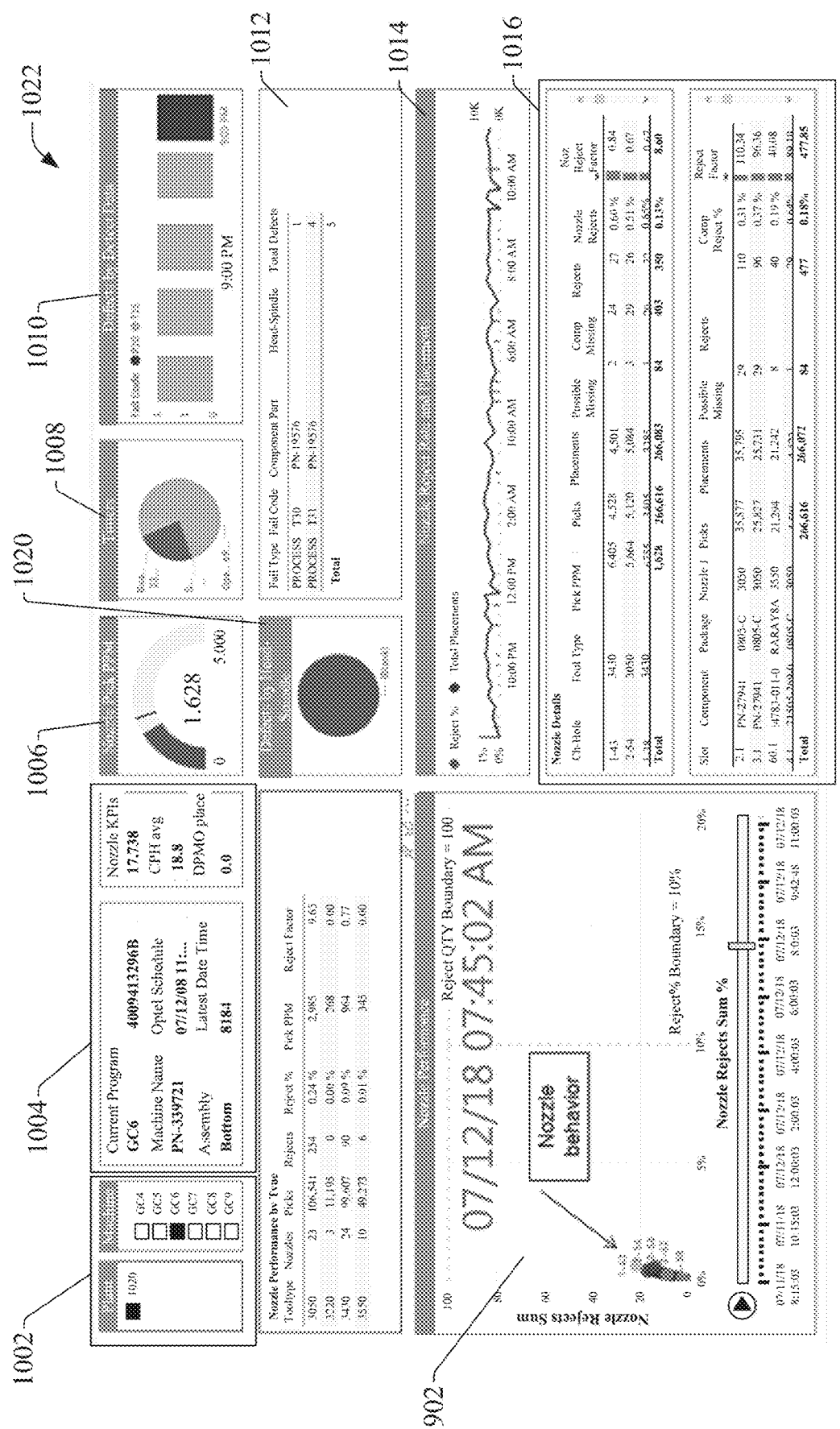
FIG. 10 is an example graphical interface that can be generated by a rendering component of a nozzle performance analytics system.

FIG. 10 is an example graphical interface 1022 that can be generated by one or more embodiments of rendering component 312. This example interface 1022 can comprise several windows that summarize nozzle performance based on analysis of the production data 812 as described above. In this example, graphical display 902 of FIG. 9 is included in the bottom left corner of interface 1022. In the top left corner, a machine selection area 1002 renders interactive machine selection controls that allow the user to select the set of nozzles whose data is to be displayed on the interface 1022. In this example, the machine selection area 1002 allows the user to select the plant and the pick and place machine of interest. In response to receiving these selections, rendering component 312 can render statistics for nozzles of the selected machine on the interface 1022, including rendering the nozzle behavior bubbles 904 corresponding to the nozzles of the selected pick and place machine.

Section 1004 renders information about the selected pick and place machine, including the name of the machine, the current program being executed by the machine, a date and time stamp of the most recently received set of production data 812, and other such information. Window 1006 displays an overall reject rate for the machine as a graphical gauge. Window 1020 renders a pie chart that breaks down the number of assembly defects per head-spindle combination. Window 1008 renders another pie chart that conveys machine timer distribution. Window 1010 renders detected defects as a function of timestamp. Window 1012 is a defect summary that lists the detected defects categorized according to a failure type and failure code.

Window 1014 renders a time-series graph plotting the nozzle reject rate for the selected machine over time. Windows 1016 renders a table that summarizes, for each nozzle, the number of picks, number of placements, number of possible missing parts, the number of rejects, reject rates, and a computed reject factor for each nozzle.

Figure 11:
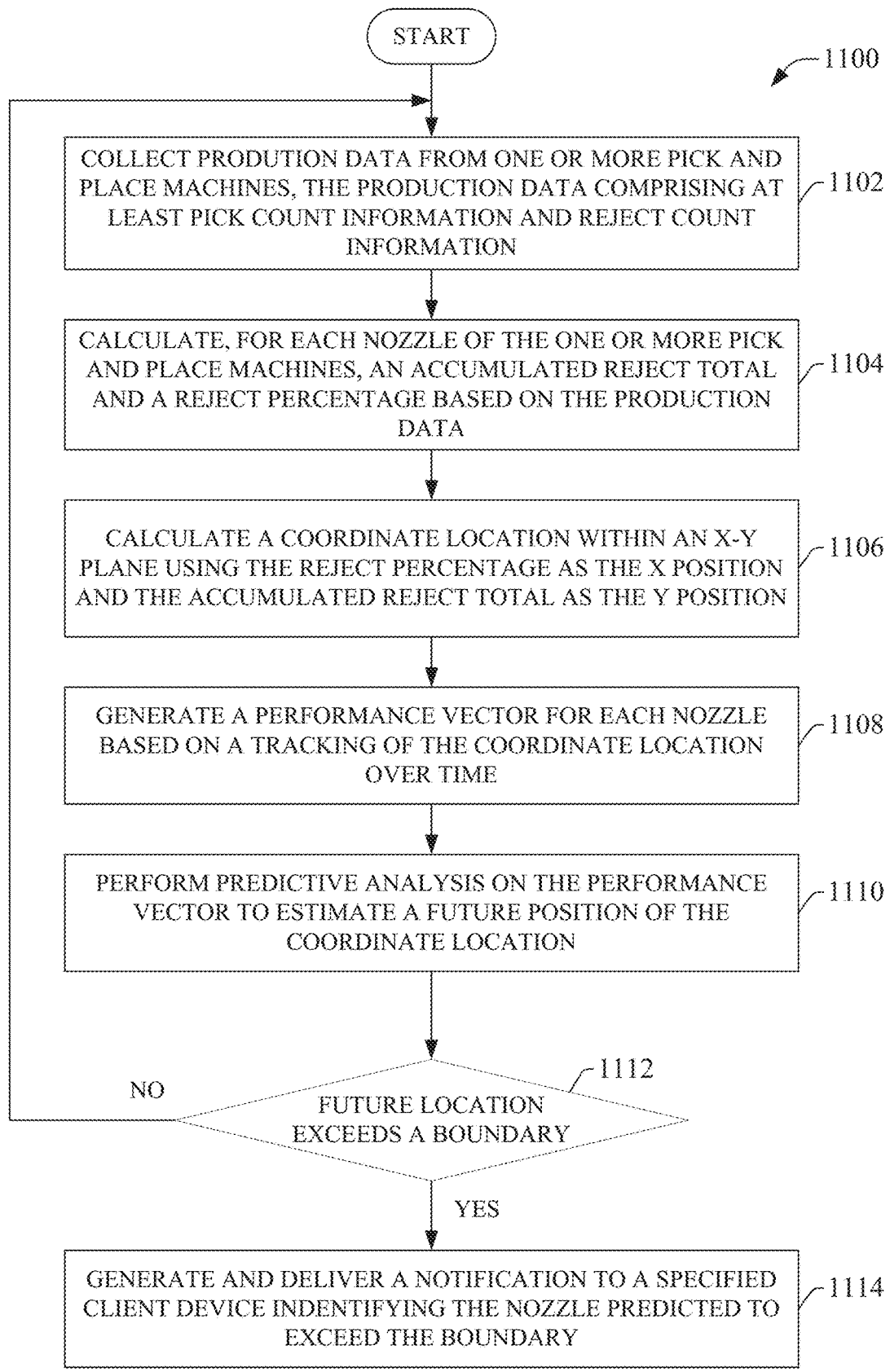
FIG. 11 is a flowchart of an example methodology for tracking performance of pick and place nozzles and proactively notifying personnel in response to predicting a nozzle performance degradation in excess of an acceptable limit.
Figure 12:
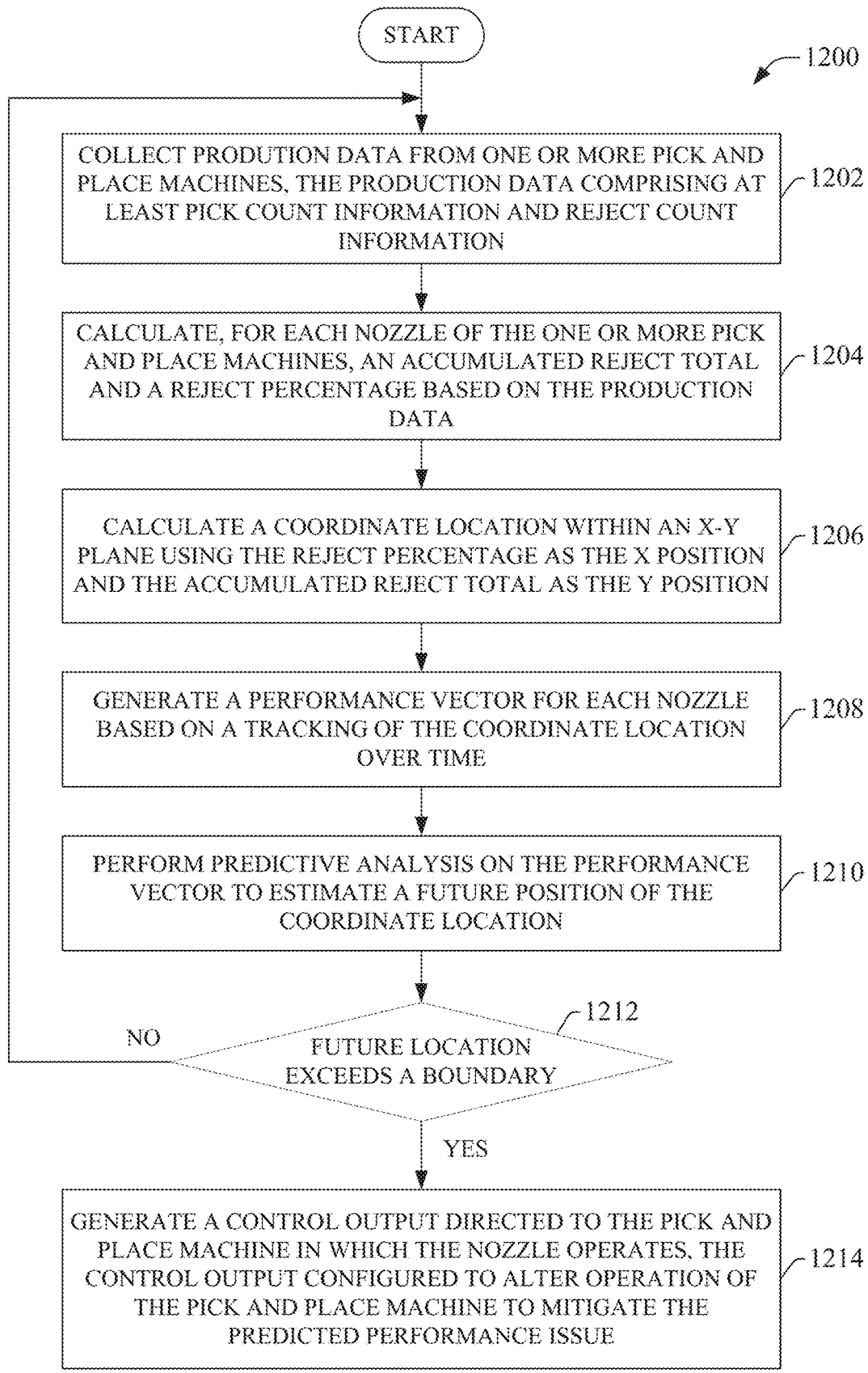
FIG. 12 is a flowchart of an example methodology for tracking performance of pick and place nozzles and proactively altering control of a pick and place machine to slow or mitigate nozzle performance degradation.

FIGS. 11-12 illustrates methodologies in accordance with one or more embodiments of the subject application. While, for purposes of simplicity of explanation, the methodologies shown herein is shown and described as a series of acts, it is to be understood and appreciated that the subject innovation is not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation. Furthermore, interaction diagram(s) may represent methodologies, or methods, in accordance with the subject disclosure when disparate entities enact disparate portions of the methodologies. Further yet, two or more of the disclosed example methods can be implemented in combination with each other, to accomplish one or more features or advantages described herein.

FIG. 11 illustrates an example methodology 1100 for tracking performance of pick and place nozzles and proactively notifying personnel in response to predicting a nozzle performance degradation in excess of an acceptable limit. Initially, at 1102, production data is collected from one or more pick and place machines, the production data comprising at least pick count information and reject count information for respective nozzles of the pick and place machine. At 1104, for each nozzle of the one or more pick and place machines, an accumulated reject total and a reject percentage is calculated based on the production data collected at step 1102.

At 1106, a coordinate location within an x-y plane is calculated using the reject percentage calculated at step 1104 as the X position and the accumulated reject total calculated at step 1104 as the Y position. At 1108, a performance vector is generated for each nozzle based on a tracking of the coordinate location within the x-y plane over time.

At 1110, predictive analysis is performed on the performance vector generated at step 1108, and a future position of the coordinate location within the x-y plane is estimated based on the predictive analysis. In some embodiments, generation of the performance vector and performance of the predictive analysis can be based on part on an accumulative model of the nozzle's performance (in terms of total and percentage of rejects) generated based on historical tracking of the coordinate location. Such analysis can consider the vector's slope, rate of change, and other such characteristics of the performance vector.

At 1112, a determination is made as to whether the future location predicted at step 1110 exceeds a boundary within the x-y plane. The boundary can be, for example, an upper boundary on the accumulated number of rejects or an upper boundary on the reject percentage for the nozzle. If the future position is not predicted to exceed a boundary (NO at step 1112), the methodology returns to step 1102. Alternatively, if the future position is predicted to exceed the boundary (YES at step 1112), the methodology proceeds to step 1114, where a notification is generated and delivered to a specified client device, the notification identifying the nozzle that is predicted to exceed the boundary. In some embodiments, the notification can also include information specifying an expected time at which the nozzle is predicted to exceed the boundary, a possible root cause of the predicted performance degradation (e.g., insufficient vacuum, an end of the nozzle's expected lifecycle, etc.), a recommended countermeasure for correcting the predicted issue, or other such information.

FIG. 12 illustrates an example methodology 1200 for tracking performance of pick and place nozzles and proactively altering control of a pick and place machine to slow or mitigate nozzle performance degradation. Steps 1202-1212 are similar to corresponding steps 1102-1112 described above in connection with FIG. 11. In this example, in response to determining that the estimated future position of the coordinate location for a nozzle exceeds a preconfigured threshold indicative of an unacceptable performance degradation (YES at step 1212), the methodology proceeds to step 1214, where a control output is generated and directed to the pick and place machine in which the affected nozzle operates. The control output is directed to a control device of the pick and place machine, and is configured to alter operation of the pick and place machine to mitigate the predicted performance issue.

Embodiments, systems, and components described herein, as well as industrial control systems and industrial automation environments in which various aspects set forth in the subject specification can be carried out, can include computer or network components such as servers, clients, programmable logic controllers (PLCs), automation controllers, communications modules, mobile computers, wireless components, control components and so forth which are capable of interacting across a network. Computers and servers include one or more processors—electronic integrated circuits that perform logic operations employing electric signals—configured to execute instructions stored in media such as random access memory (RAM), read only memory (ROM), a hard drives, as well as removable memory devices, which can include memory sticks, memory cards, flash drives, external hard drives, and so on.

Similarly, the term PLC or automation controller as used herein can include functionality that can be shared across multiple components, systems, and/or networks. As an example, one or more PLCs or automation controllers can communicate and cooperate with various network devices across the network. This can include substantially any type of control, communications module, computer, Input/Output (I/O) device, sensor, actuator, and human machine interface (HMI) that communicate via the network, which includes control, automation, and/or public networks. The PLC or automation controller can also communicate to and control various other devices such as standard or safety-rated I/O modules including analog, digital, programmed/intelligent I/O modules, other programmable controllers, communications modules, sensors, actuators, output devices, and the like.

The network can include public networks such as the internet, intranets, and automation networks such as control and information protocol (CIP) networks including DeviceNet, ControlNet, and Ethernet/IP. Other networks include Ethernet, DH/DH+, Remote I/O, Fieldbus, Modbus, Profibus, CAN, wireless networks, serial protocols, and so forth. In addition, the network devices can include various possibilities (hardware and/or software components). These include components such as switches with virtual local area network (VLAN) capability, LANs, WANs, proxies, gateways, routers, firewalls, virtual private network (VPN) devices, servers, clients, computers, configuration tools, monitoring tools, and/or other devices.

Figure 13:
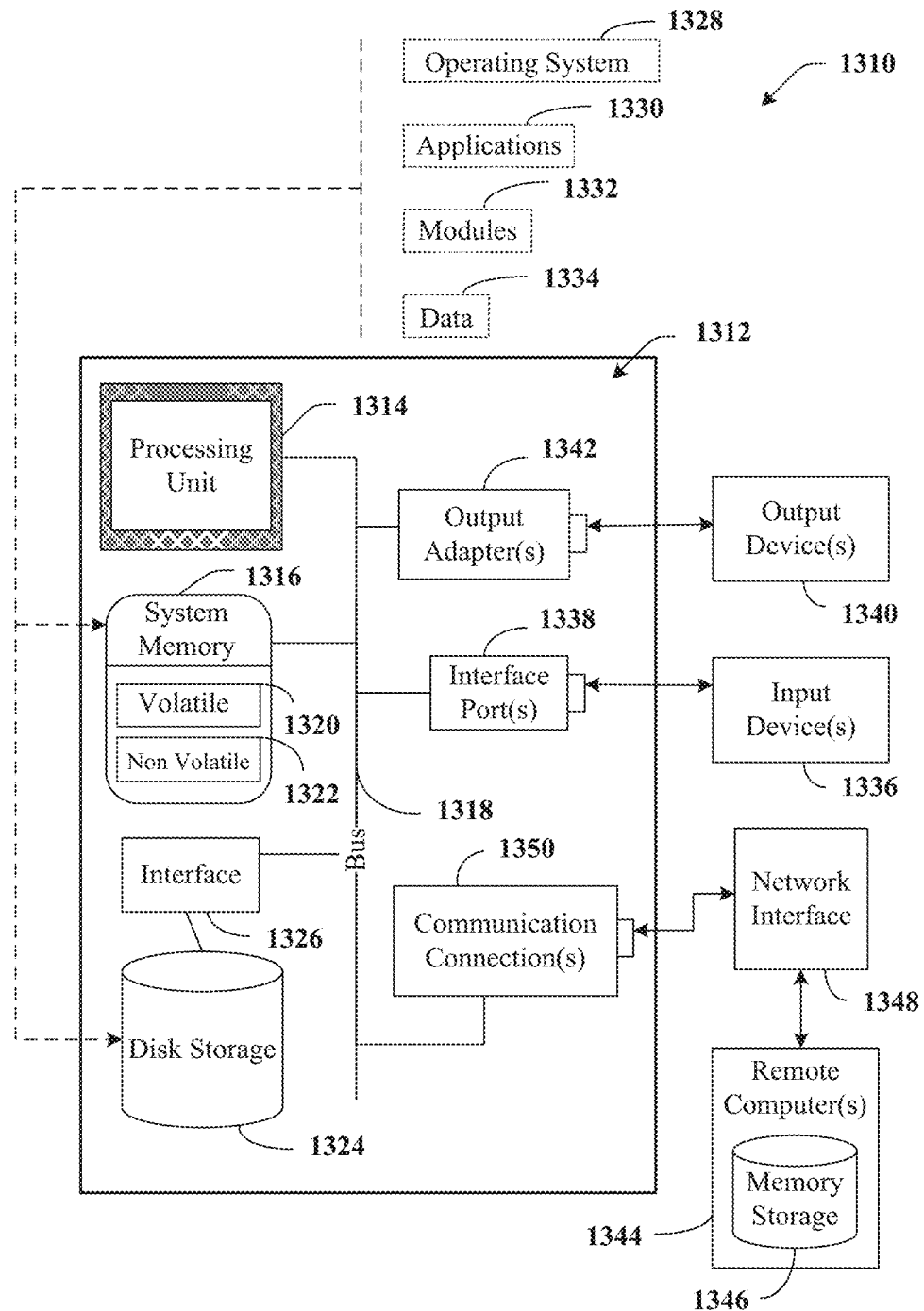
FIG. 13 is an example computing environment.
Figure 14:
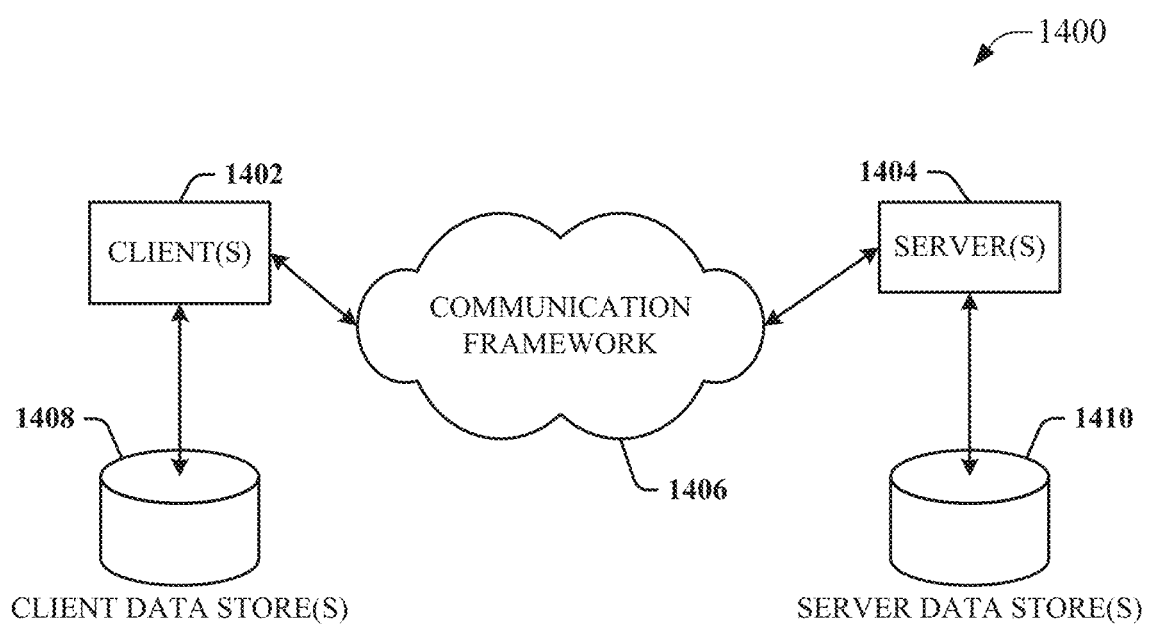
FIG. 14 is an example networking environment.

In order to provide a context for the various aspects of the disclosed subject matter, FIGS. 13 and 14 as well as the following discussion are intended to provide a brief, general description of a suitable environment in which the various aspects of the disclosed subject matter may be implemented.

With reference to FIG. 13, an example environment 1310 for implementing various aspects of the aforementioned subject matter includes a computer 1312. The computer 1312 includes a processing unit 1314, a system memory 1316, and a system bus 1318. The system bus 1318 couples system components including, but not limited to, the system memory 1316 to the processing unit 1314. The processing unit 1314 can be any of various available processors. Multicore microprocessors and other multiprocessor architectures also can be employed as the processing unit 1314.

The system bus 1318 can be any of several types of bus structure(s) including the memory bus or memory controller, a peripheral bus or external bus, and/or a local bus using any variety of available bus architectures including, but not limited to, 8-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

The system memory 1316 includes volatile memory 1320 and nonvolatile memory 1322. The basic input/output system (BIOS), containing the basic routines to transfer information between elements within the computer 1312, such as during start-up, is stored in nonvolatile memory 1322. By way of illustration, and not limitation, nonvolatile memory 1322 can include read only memory (ROM), programmable ROM (PROM), electrically programmable ROM (EPROM), electrically erasable PROM (EEPROM), or flash memory. Volatile memory 1320 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 1312 also includes removable/non-removable, volatile/non-volatile computer storage media. FIG. 13 illustrates, for example a disk storage 1324. Disk storage 1324 includes, but is not limited to, devices like a magnetic disk drive, floppy disk drive, tape drive, Jaz drive, Zip drive, LS-100 drive, flash memory card, or memory stick. In addition, disk storage 1324 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1324 to the system bus 1318, a removable or non-removable interface is typically used such as interface 1326.

It is to be appreciated that FIG. 13 describes software that acts as an intermediary between users and the basic computer resources described in suitable operating environment 1310. Such software includes an operating system 1328. Operating system 1328, which can be stored on disk storage 1324, acts to control and allocate resources of the computer 1312. System applications 1330 take advantage of the management of resources by operating system 1328 through program modules 1332 and program data 1334 stored either in system memory 1316 or on disk storage 1324. It is to be appreciated that one or more embodiments of the subject disclosure can be implemented with various operating systems or combinations of operating systems.

A user enters commands or information into the computer 1312 through input device(s) 1336. Input devices 1336 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1314 through the system bus 1318 via interface port(s) 1338. Interface port(s) 1338 include, for example, a serial port, a parallel port, a game port, and a universal serial bus (USB). Output device(s) 1340 use some of the same type of ports as input device(s) 1336. Thus, for example, a USB port may be used to provide input to computer 1312, and to output information from computer 1312 to an output device 1340. Output adapters 1342 are provided to illustrate that there are some output devices 1340 like monitors, speakers, and printers, among other output devices 1340, which require special adapters. The output adapters 1342 include, by way of illustration and not limitation, video and sound cards that provide a means of connection between the output device 1340 and the system bus 1318. It should be noted that other devices and/or systems of devices provide both input and output capabilities such as remote computer(s) 1344.

Computer 1312 can operate in a networked environment using logical connections to one or more remote computers, such as remote computer(s) 1344. The remote computer(s) 1344 can be a personal computer, a server, a router, a network PC, a workstation, a microprocessor based appliance, a peer device or other common network node and the like, and typically includes many or all of the elements described relative to computer 1312. For purposes of brevity, only a memory storage device 2246 is illustrated with remote computer(s) 1344. Remote computer(s) 1344 is logically connected to computer 1312 through a network interface 1348 and then physically connected via communication connection 1350. Network interface 1348 encompasses communication networks such as local-area networks (LAN) and wide-area networks (WAN). LAN technologies include Fiber Distributed Data Interface (FDDI), Copper Distributed Data Interface (CDDI), Ethernet/IEEE 802.3, Token Ring/IEEE 802.5 and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1350 refers to the hardware/software employed to connect the network interface 1348 to the system bus 1318. While communication connection 1350 is shown for illustrative clarity inside computer 1312, it can also be external to computer 1312. The hardware/software necessary for connection to the network interface 1348 includes, for exemplary purposes only, internal and external technologies such as, modems including regular telephone grade modems, cable modems and DSL modems, ISDN adapters, and Ethernet cards.

FIG. 14 is a schematic block diagram of a sample computing environment 1400 with which the disclosed subject matter can interact. The sample computing environment 1400 includes one or more client(s) 1402. The client(s) 1402 can be hardware and/or software (e.g., threads, processes, computing devices). The sample computing environment 1400 also includes one or more server(s) 1404. The server(s) 1404 can also be hardware and/or software (e.g., threads, processes, computing devices). The servers 1404 can house threads to perform transformations by employing one or more embodiments as described herein, for example. One possible communication between a client 1402 and servers 1404 can be in the form of a data packet adapted to be transmitted between two or more computer processes. The sample computing environment 1400 includes a communication framework 1406 that can be employed to facilitate communications between the client(s) 1402 and the server(s) 1404. The client(s) 1402 are operably connected to one or more client data store(s) 1408 that can be employed to store information local to the client(s) 1402. Similarly, the server(s) 1404 are operably connected to one or more server data store(s) 1410 that can be employed to store information local to the servers 1404.

What has been described above includes examples of the subject innovation. It is, of course, not possible to describe every conceivable combination of components or methodologies for purposes of describing the disclosed subject matter, but one of ordinary skill in the art may recognize that many further combinations and permutations of the subject innovation are possible. Accordingly, the disclosed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the disclosed subject matter. In this regard, it will also be recognized that the disclosed subject matter includes a system as well as a computer-readable medium having computer-executable instructions for performing the acts and/or events of the various methods of the disclosed subject matter.

In addition, while a particular feature of the disclosed subject matter may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

In this application, the word "exemplary" is used to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks [e.g., compact disk (CD), digital versatile disk (DVD) . . . ], smart cards, and flash memory devices (e.g., card, stick, key drive . . . ).

What is claimed is:

1. A system for collecting and analyzing industrial performance data, comprising:
 a processor that executes executable components stored on a memory, the executable components comprising:
  a data aggregation component configured to generate performance vector data for a nozzle of a pick and place machine based on production data collected from the pick and place machine, wherein the performance vector data defines a location, over time, of a vector point of the nozzle within an x-y plane, and the data aggregation component determines the location of the vector point as a plot of a total number of rejects for the nozzle on a y-axis of the x-y plane and a percentage of rejects for the nozzle on an x-axis of the x-y plane;
  a vector analysis component configured to track a movement of the location of the vector point based on an analysis of the performance vector data; and
  a notification component configured to generate notification data directed to a client device in response to determining that the movement of the location of the vector point satisfies a defined criterion.

2. The system of claim 1, wherein the system is embodied on at least one of a cloud platform or an edge device.

3. The system of claim 1, further comprising a rendering component configured to render, on the client device, a graph depicting the x-y plane and a plot of the vector point for the nozzle on the x-y plane.

4. The system of claim 3, wherein
 the notification data is first notification data,
 the vector analysis component is further configured to predict a future trajectory of the location of the vector point based on an analysis of the performance vector data, and
 the notification component is further configured to generate second notification data directed to the client device in response to determining that the future trajectory causes the location of the vector point to exceed a preconfigured threshold.

5. The system of claim 3, wherein
 the data aggregation component is further configured to separately track the total number of rejects for the nozzle and the percentage of rejects for the nozzle for respective different programs executed by the pick and place machine, and
 the rendering component is configured to plot the vector point for the nozzle based on a subset of the production data corresponding to a program, of the different programs, currently executed by the pick and place machine.

6. The system of claim 5, wherein the rendering component is configured to render the vector point as a bubble on the graph depicting the x-y plane, wherein the bubble has a radius that is a function of multiple variables or measures over individual time periods.

7. The system of claim 1, wherein
 the vector analysis component is further configured to, in response to determining that the movement of the location of the vector point satisfies the defined criterion, generate a control output directed to the pick and place machine, and
 the control output is configured to alter an operation of the pick and place machine in a manner estimated to reduce a rate of rejects by the nozzle.

8. The system of claim 3, wherein
 the rendering component is further configured to render, on the client device, a performance interface display comprising at least the graph depicting the x-y plane and a machine selection control that facilitates, via interaction with the machine selection control, selection of a selected pick and place machine of one or more pick and place machines, and
 the selection of the selected pick and place machine causes the rendering component to render, on the graph depicting the x-y plane, vector points for a set of nozzles corresponding to the selected pick and place machine.

9. The system of claim 5, wherein
 the vector analysis component is further configured to record performance model data for the nozzle based on the analysis of the performance vector data,
 the performance model data models performance of the nozzle as a function of the respective different programs, and
 the vector analysis component is configured to predict the future trajectory of the location based in part on the performance model data.

10. The system of claim 1, wherein the defined criterion is at least one of a defined direction of the movement of the location of the vector point or a defined rate of change of the movement of the location of the vector point.

11. A method, comprising:
 generating, by a system comprising a processor, performance vector data for a nozzle of a pick and place machine based on production data collected from the pick and place machine, the performance vector data defining a location, as a function of time, of a vector point of the nozzle within an x-y plane, wherein the generating comprises determining the location of the vector point as a plot of a total number of rejects for the nozzle on a y-axis of the x-y plane and a percentage of rejects for the nozzle on an x-axis of the x-y plane; and in response to determining that a movement of the location of the vector point satisfies a defined criterion, generating, by the system, notification data directed to a client device.

12. The method of claim 11, further comprising rendering, by the system on the client device, a graphical representation of the x-y plane; and rendering, by the system on the client device, a plot of the vector point for the nozzle on the graphical representation of the x-y plane.

13. The method of claim 12, wherein the notification data is first notification data, and the method further comprises:

predicting, by the system, a future trajectory of the location of the vector point based on an analysis of the performance vector data, and in response to predicting that the future trajectory will cause the location of the vector point to exceed a defined threshold, generating, by the system, second notification data directed to the client device.

14. The method of claim 12, further comprising:

tracking, by the system, the total number of rejects for the nozzle and the percentage of rejects for the nozzle separately for respective different programs executed by the pick and place machine; and plotting, by the system, the vector point for the nozzle based on a subset of the production data corresponding to a program, of the different programs, currently executed by the pick and place machine.

15. The method of claim 14, wherein the rendering of the plot of the vector point comprises rendering the vector point on the graphical representation of the x-y plane as a bubble having a radius that is a function of multiple variables or measures over individual time periods.

16. The method of claim 11, further comprising:

in response to determining that the movement of the location of the vector point satisfies the defined criterion, generating, by the system, a control output directed to the pick and place machine, wherein the control output is configured to alter an operation of the pick and place machine in a manner predicted to reduce a rate of rejects by the nozzle.

17. The method of claim 11, further comprising recording, by the system, performance model data for the nozzle based on an analysis of the performance vector data, wherein the performance model data models performance of the nozzle as a function of the respective different programs.

18. The method of claim 17, wherein the notification data is first notification data, and the method further comprises:

predicting, by the system, a future trajectory of the location of the vector point based on an analysis of the performance vector data and the performance model data, and in response to predicting that the future trajectory will cause the location of the vector point to exceed a defined threshold, generating, by the system, second notification data directed to the client device.

19. A non-transitory computer-readable medium having stored thereon instructions that, in response to execution, cause a system comprising a processor to perform operations, the operations comprising:

generating performance vector data for a nozzle of a pick and place machine based on analysis of production data generated by the pick and place machine, wherein the performance vector data defines a location, as a function of time, of a vector point of the nozzle within an x-y plane, and wherein the generating comprises determining, as the location of the vector point, a plot of a total number of rejects for the nozzle along a y-axis of the x-y plane and a percentage of rejects for the nozzle along an x-axis of the x-y plane;

tracking the performance vector data to determine a movement of the location of the vector point over time; and in response to determining that the movement of the location of the vector point over time satisfies a defined criterion, generating, by the system, notification data directed to a client device.

20. The non-transitory computer-readable medium of claim 19, wherein the operations further comprise:

rendering, on the client device, a graph of the x-y plane; and rendering, on the client device, a plot of the vector point for the nozzle on the graph of the x-y plane.

* * * * *